US010269395B2

(12) United States Patent
Arai et al.

(10) Patent No.: US 10,269,395 B2
(45) Date of Patent: Apr. 23, 2019

(54) SEMICONDUCTOR MEMORY DEVICE INCLUDING OUTPUT BUFFER

(71) Applicant: Micron Technology, Inc., Boise, ID (US)

(72) Inventors: Tetsuya Arai, Tokyo (JP); Junki Taniguchi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 14/705,762

(22) Filed: May 6, 2015

(65) Prior Publication Data

US 2015/0323971 A1 Nov. 12, 2015

(30) Foreign Application Priority Data

May 12, 2014 (JP) ................................. 2014-098420

(51) Int. Cl.
G01R 31/319 (2006.01)
G11C 7/10 (2006.01)
G06F 1/26 (2006.01)

(52) U.S. Cl.
CPC ........ G11C 7/1057 (2013.01); G01R 31/3191 (2013.01); G06F 1/266 (2013.01); G11C 2207/2254 (2013.01)

(58) Field of Classification Search
CPC ...... G01R 35/005; G01R 35/00; G01R 17/02; G01R 27/02; G01R 27/16; G01R 31/3191; G01R 31/343; G01R 35/007; H03H 7/40; H03H 17/0045; H03H 7/38; H03H 9/17; H03H 9/21; H04L 25/0278; G05B 13/021; H01L 41/09; H01L 51/0049; H01L 51/0558; H02J 50/80
See application file for complete search history.

(56) References Cited

U.S. PATENT DOCUMENTS

| 5,396,028 | A | * | 3/1995 | Tomassetti | .......... H04L 25/0278 178/69 R |
| 5,621,329 | A | * | 4/1997 | Tsao | .......... G01R 1/28 324/601 |
| 5,742,550 | A | * | 4/1998 | Yamauchi | ............. G06F 9/3869 365/189.05 |
| 6,127,862 | A | * | 10/2000 | Kawasumi | ......... H03K 19/0005 326/27 |
| 7,514,954 | B2 | * | 4/2009 | Kim | ..................... G11C 7/1051 326/30 |
| 7,782,078 | B2 | * | 8/2010 | Koo | ....................... G11C 5/063 326/30 |
| 9,312,843 | B2 | * | 4/2016 | Jeong | ..................... H03K 5/249 |

(Continued)

FOREIGN PATENT DOCUMENTS

| JP | 2006-203405 | 8/2006 |
| JP | 2011-119632 | 6/2011 |

Primary Examiner — Jaweed A Abbaszadeh
Assistant Examiner — Brian J Corcoran
(74) Attorney, Agent, or Firm — Dorsey & Whitney LLP

(57) ABSTRACT

An apparatus includes an external terminal, an output circuit having an impedance corresponding to a code signal, and a calibration circuit configured to produce the code signal responsive to a comparison of a voltage at the external terminal with a reference voltage, the comparison performed by a first cycle period in a first mode and by a second cycle which is longer than the first cycle period in a second mode.

12 Claims, 17 Drawing Sheets

(56) References Cited

U.S. PATENT DOCUMENTS

| | | | | |
|---|---|---|---|---|
| 2005/0110516 A1* | 5/2005 | Ueno | ............... | H03K 19/0005 |
| | | | | 326/30 |
| 2006/0158198 A1* | 7/2006 | Fujisawa | ............... | G11C 29/02 |
| | | | | 324/601 |
| 2007/0086267 A1* | 4/2007 | Kwak | ............... | G11C 7/02 |
| | | | | 365/233.1 |
| 2007/0126466 A1* | 6/2007 | Kim | ............... | G11C 29/02 |
| | | | | 326/30 |
| 2007/0152704 A1* | 7/2007 | Park | ............... | G11C 7/1051 |
| | | | | 326/30 |
| 2008/0219068 A1* | 9/2008 | Kim | ............... | G11C 7/04 |
| | | | | 365/198 |
| 2008/0310244 A1* | 12/2008 | Baker | ............... | G11C 7/02 |
| | | | | 365/207 |
| 2009/0273364 A1* | 11/2009 | Jeong | ............... | G11C 7/1051 |
| | | | | 326/30 |
| 2010/0188102 A1* | 7/2010 | Kaiwa | ............... | G11C 7/1051 |
| | | | | 324/601 |
| 2012/0146687 A1* | 6/2012 | Kim | ............... | H03K 19/0005 |
| | | | | 326/30 |

* cited by examiner

SEMICONDUCTOR MEMORY DEVICE INCLUDING OUTPUT BUFFER

This application is based upon and claims the benefit of priority from Japanese Patent Application No. 2014-098420 filed on May 12, 2014, the disclosure of which are incorporated herein in its entirely by reference.

FIELD OF THE INVENTION

The present invention relates to a semiconductor device and a semiconductor system provided with such a semiconductor device, and in particular, related to a semiconductor device provided with a calibration circuit for controlling an impedance of an output unit and a semiconductor system provided with such a semiconductor device.

DESCRIPTION OF PRIOR ART

A semiconductor device, such as a DRAM (Dynamic Random Access Memory) includes an output unit for outputting data to the outside. The output unit is designed so as to provide a desired impedance when activated. However, due to influences such as process deviations and temperature changes, the desired impedance as designed is not necessarily obtained. For this reason, in the semiconductor device in which the impedance of the output unit needs to be controlled with high precision, an impedance adjusting circuit which is referred to as a calibration circuit has been provided (see JP-A No. 2011-119632 and JP-A No. 2006-203405).

The calibration operation is executed not only responsive to a calibration command issued from the outside, but also at the time of an initialization operation after power application. Neither a reading operation nor a writing operation is carried out during the calibration operation. Therefore, noise from the reading operation or writing operation does not cause adverse effects to the calibration operation.

However, in recent years, a semiconductor device has been proposed in which the reading operation and the writing operation can be carried out even during the calibration operation. The inventor found that, in this case, by taking into consideration influences of noise caused during the reading operation and writing operation, the calibration operation needs to be carried out.

DETAILED DESCRIPTION OF THE EMBODIMENTS

Figure 1:
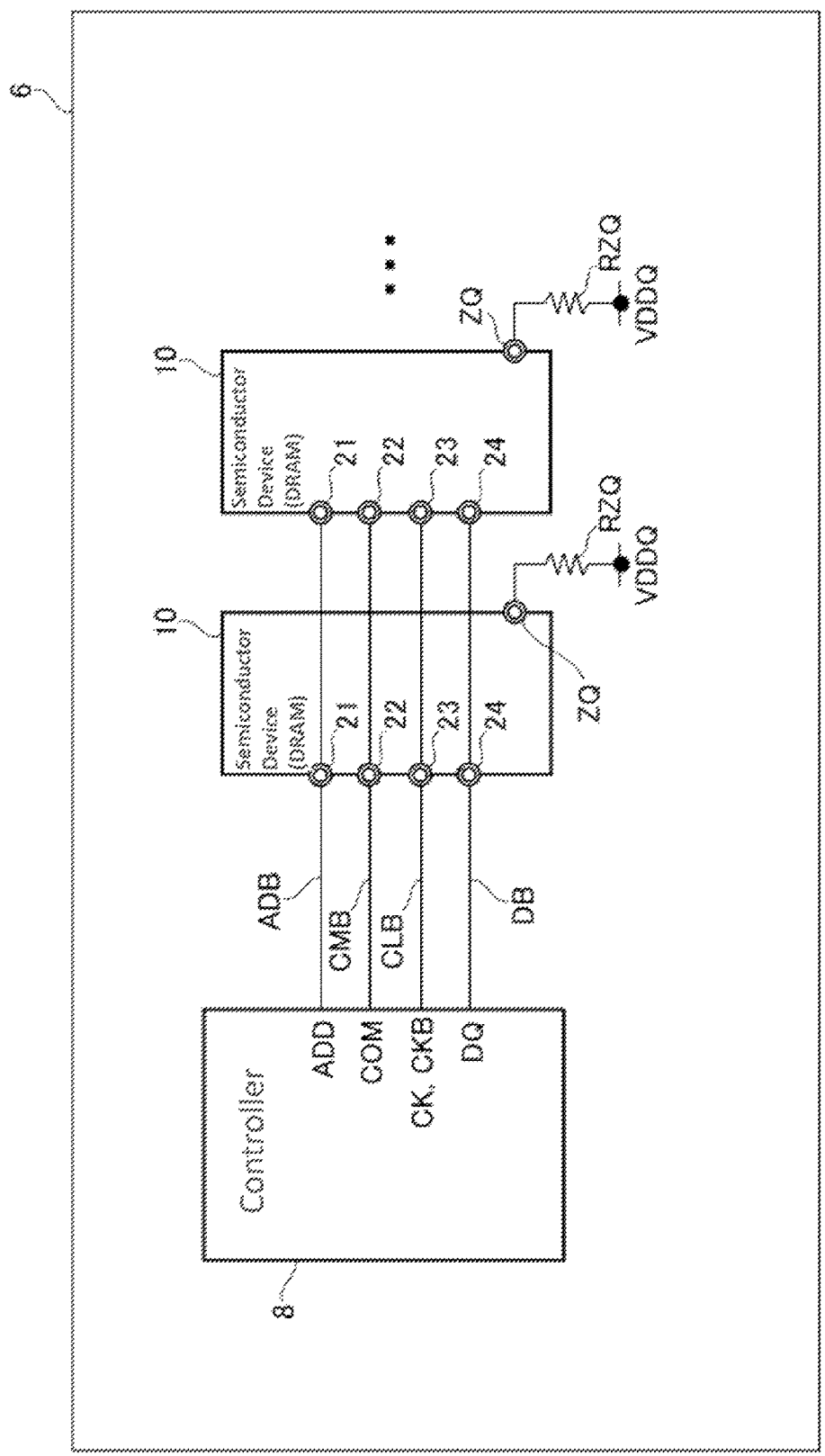
FIG. 1 is a block diagram showing configuration of a semiconductor system provided with a semiconductor device.

FIG. 1 is a block diagram showing a configuration of a semiconductor system 6 provided with a semiconductor device 10.

The semiconductor system 6 includes a plurality of semiconductor devices 10 and a controller 8 that controls these devices. Although not particularly limited, each semiconductor device 10 can be a DRAM of a DDR4 (Double Data Rate 4) type integrated into a single semiconductor chip, which carries out reading and writing operations based upon an address signal ADD, a command signal COM and external clock signals CK and CKB, supplied from the controller 8.

The address signal ADD is commonly supplied to address terminals 21 of the plural semiconductor devices 10 through an address bus ADB. The command signal COM is commonly supplied to command terminals 22 of the plural semiconductor devices 10 through a command bus CMB. In this case, however, with respect to some of the command signal COM, such as a chip select signal or the like, those signals may be individually supplied to one or two or more semiconductor devices 10. The external clock signals CK and CKB are commonly supplied to clock terminals 23 of the plural semiconductor devices 10 through a clock bus CLB.

Read data DQ is outputted from the data input/output terminal 24 of each semiconductor device 10 at the time of a reading operation, and is then supplied to the controller 8 through the data bus DB. On the other hand, write data DQ outputted from the controller 8 at the time of a writing operation is supplied to the data input/output terminal 24 of each semiconductor device 10 through the data bus DB. As shown in FIG. 1, the data bus DB is commonly connected to the plural semiconductor devices 10 as shown in FIG. 1.

The semiconductor devices of the present invention are not necessarily prepared as semiconductor devices capable of carrying out an inputting operation (writing operation) of data, and may be prepared as devices only capable of carrying out a data outputting operation (reading operation), such as a semiconductor memory device of a ROM type. In this case, data output terminals are used in place of the data input/output terminals.

A calibration terminal ZQ is provided in each semiconductor device 10. The calibration terminal ZQ is connected to a power supply electric potential VDDQ through a reference resistance element RZQ provided on a memory module substrate or a mother board. The reference resistance element RZQ is a resistance that is referred to at the time of a calibration operation to be described later. With respect to the resistance value of other elements or circuits, if the resistance value is the same as the resistance value of the reference resistance element RZQ, it is denoted as "RZQ".

Figure 2:
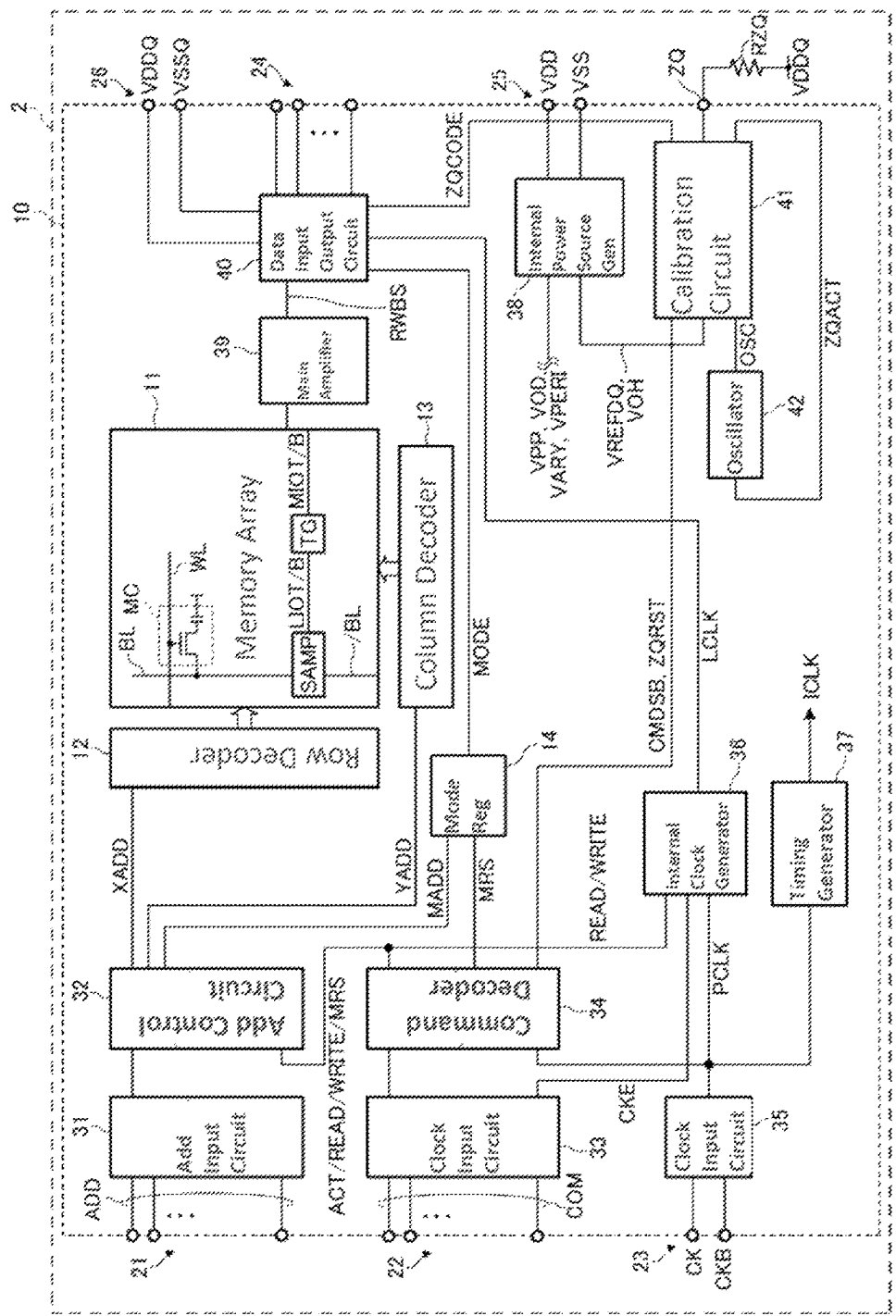
FIG. 2 is a block diagram showing an entire configuration of the semiconductor device.

FIG. 2 is a block diagram showing an entire configuration of the semiconductor device 10.

The semiconductor device 10 is assembled on an external substrate 2. The external substrate 2 may be a memory module substrate or a mother board forming the semiconductor system 6 to which the reference resistance element RZQ is provided. As described earlier the reference resistance element RZQ is connected to a calibration terminal ZQ of the semiconductor device 10, and its impedance is used as a reference impedance of the calibration circuit 41.

As shown in FIG. 2, the semiconductor device 10 has a memory cell array 11. The memory cell array 11 includes a plurality of word lines WL and a plurality of bit lines BL, /BL, and has a configuration in which memory cells MC are disposed on these intersections. The selection of the word line WL is carried out by a row decoder 12, and the selection of the bit lines BL, /BL is carried out by a column decoder 13.

The paired bit lines BL, /BL are connected to a sense amplifier SAMP in the memory cell array 11. The sense amplifier SAMP amplifies an electric potential difference occurring between the bit lines BL and /BL and supplies read data thus obtained to a complementary local IO line LIOT/LIOB, The read data supplied to the local 10 line LIOT/LIOB is transferred to a complementary main IO line MIOT/MIOB through a switch circuit TG. Then, the read data on the main IO line MIOT/MIOB is converted to a signal of a single end format by a main amplifier 39, and supplied to the data input/output circuit 40 through a read/write bus RWBS.

The semiconductor device 10 includes an address terminal 21, a command terminal 22, a clock terminal 23, a data input/output terminal 24, power supply terminals 25, 26, and a calibration terminal ZQ, as external terminals.

The address terminal 21 is a terminal to which an address signal ADD is externally inputted. The address signal ADD is supplied to an address control circuit 32 through an address input circuit 31. Of the address signals ADD supplied to the address control circuit 32, a row address XADD is supplied to the row decoder 12, a column address YADD is supplied to the column decoder 13, and a mode signal MADD is supplied to a mode register 14.

The mode register 14 is a circuit for use in setting a parameter indicating an operation mode of the semiconductor device 10. A mode signal outputted from the mode register 14 includes an impedance selection signal MODE. The impedance selection signal MODE is supplied to the data input/output circuit 40. The impedance selection signal MODE is a signal for use in selecting an output impedance at the time of a reading operation.

The command terminal 22 is a terminal to which a command signal COM is externally inputted. The command signal COM is supplied to a command decode circuit 34 through a command input circuit 33. Moreover of the command signals COM, a clock enable signal CKE is also supplied to an inner clock generation circuit 36. The command decode circuit 34 generates various inner commands by decoding the command signals COM. The inner commands include an active signal ACT, a read signal READ, a write signal WRITE, a mode register setting signal MRS, a calibration signal CMDSB, a reset signal ZQRST, and the like.

The active signal ACT can be activated when the command signal COM indicates a row access (active command). When the active signal ACT is activated, the row address XADD latched by the address control circuit 32 is supplied to the row decoder 12. Thus, a word line WL specified by the row address XADD is selected.

The read signal READ and the write signal WRITE can be respectively activated when the command signal COM respectively indicate the read command and write command. When the read signal READ or the write signal WRITE is activated, a column address YADD latched by the address control circuit 32 is supplied to the column decoder 13. Thus, a bit line BL or /BL specified by the corresponding column address YADD is selected.

Therefore, by inputting the active command and the read command, as well as inputting a row address XADD and a column address YADD in synchronism with these, read data is read out from a memory cell MC specified by these row address XADD and column address YADD. The read data DQ is externally outputted from the data input/output terminal 24 through the main amplifier 39 and the data input/output circuit 40.

On the other hand, by inputting the active command and the write command, as well as inputting a row address XADD and a column address YADD in synchronism with these, with write data DQ being then inputted to the data input/output terminal 24, the write data DQ is supplied to the memory cell array 11 through the data input/output circuit 40 and the main amplifier 39, and written onto a memory cell MC specified by the row address XADD and the column address YADD.

The mode register setting signal MRS is activated when the command signal COM indicates a mode register setting command. Therefore, by inputting the mode register setting command, as well as inputting a mode signal MADD from the address terminal 21 in synchronism with these, the set value of the mode register 14 can be rewritten.

The calibration signal CMDSB can be activated when the command signal COM indicates a calibration command. When the calibration signal CMDSB is activated, the calibration circuit 41 carries out a calibration operation so as to subsequently generate an impedance code ZQCODE.

Upon application of power to the semiconductor circuit 10, the command decode circuit 34 executes an initial setting operation so that the reset signal ZQRST and the calibration signal CMDSB are activated in this order. The reset signal ZQRST is a signal for resetting the calibration circuit 41. Thus, upon application of power to the semiconductor device 10, after having been reset to the initial state, the calibration circuit 41 automatically executes a calibration operation. In the case when a reset command is issued from the outside also, the command decode circuit 34 activates the reset signal ZQRST and the calibration signal CMDSB in this order.

Here, going back to the explanation of the external terminal provided in the semiconductor device 10, the external clock signals CK and CKB are inputted to the clock terminal 23. The external clock signal CK and the external clock signal CKB are mutually complementary signals, and are supplied to the clock input circuit 35. Upon receipt of the external clock signals CK and CKB, the clock input circuit 35 generates an inner clock signal PCLK. The inner clock signal PCLK is supplied to the inner clock generation circuit 36 that is activated by the clock enable signal CKE. An inner clock signal LCLK, which is thus phase-controlled, is generated. Although not particularly limited, a DLL circuit may be used as the inner clock generation circuit 36. The inner clock signal LCLK is supplied to the data input/output circuit 40, and used as a timing signal that determines the output timing of the read data DQ.

The inner clock signal PCLK is also supplied to a timing generator 37, which generates various inner clock signals ICLK. The various inner clock signals ICLK are supplied to circuit blocks, such as the address control circuit 32 and command decode circuit 34, so as to regulate the operation timings of these circuit blocks.

The power supply terminal 25 is a terminal through which power supply electric potentials VDD and VSS are supplied. The power supply electric potentials VDD and VSS are first supplied to an inner power supply generation circuit 38. Based upon the power supply electric potentials VDD and VSS, the inner power supply generation circuit 38 generates various inner electric potentials VPP, VOD, VARY and VPERI as well as reference electric potentials ZQVREF and VOH. The inner electric potential VPP has an electric potential to be mainly used by the row decoder 12, the inner electric potentials VOD and VARY have electric potentials to be used by the sense amplifier SAMP in the memory cell array 11. The inner electric potential VPERI has an electric potential to be used by many other circuit blocks. On the other hand, the reference electric potentials ZQVREF and VOH are reference electric potentials to be used in the calibration circuit 41.

The power supply terminal 26 is a terminal through which power supply electric potentials VDDQ and VSSQ are supplied. The power supply electric potentials VDDQ and VSSQ are first supplied to the data input/output circuit 40. The power supply electric potentials VDDQ and VSSQ respectively have the same electric potentials as those of the power supply electric potentials VDD and VSS to be supplied to the power supply terminal 25. However, so as to prevent power supply noise generated by the data input/output circuit 40 from propagating to other circuit blocks, the exclusively used power supply electric potentials VDDQ and VSSQ can be used for the data input/output circuit 40.

The calibration terminal ZQ is connected to the calibration circuit 41. When activated by a calibration signal CMDSB, the calibration circuit 41 carries out a calibration operation by referencing the impedance of the reference resistance element RZQ and the reference electric potentials ZQVREF and VOH. An impedance code ZQCODE obtained by the calibration operation is supplied to the data input/output circuit 40, and the impedance of an output unit included in the data input/output circuit 40 is thus determined. Moreover, the calibration circuit 41 is reset by the reset signal ZQRST.

The calibration circuit 41 executes the calibration operation in synchronism with an oscillator clock signal OSC generated by an oscillator 42. The oscillator clock signal OSC is a first clock signal that is asynchronous to the external clock signals CK and CKB. The oscillator 42 is activated by a calibration state signal ZQACT outputted from the calibration circuit 41. The calibration state signal ZQACT is a state signal indicating that the calibration circuit 41 is activated.

Figure 3:
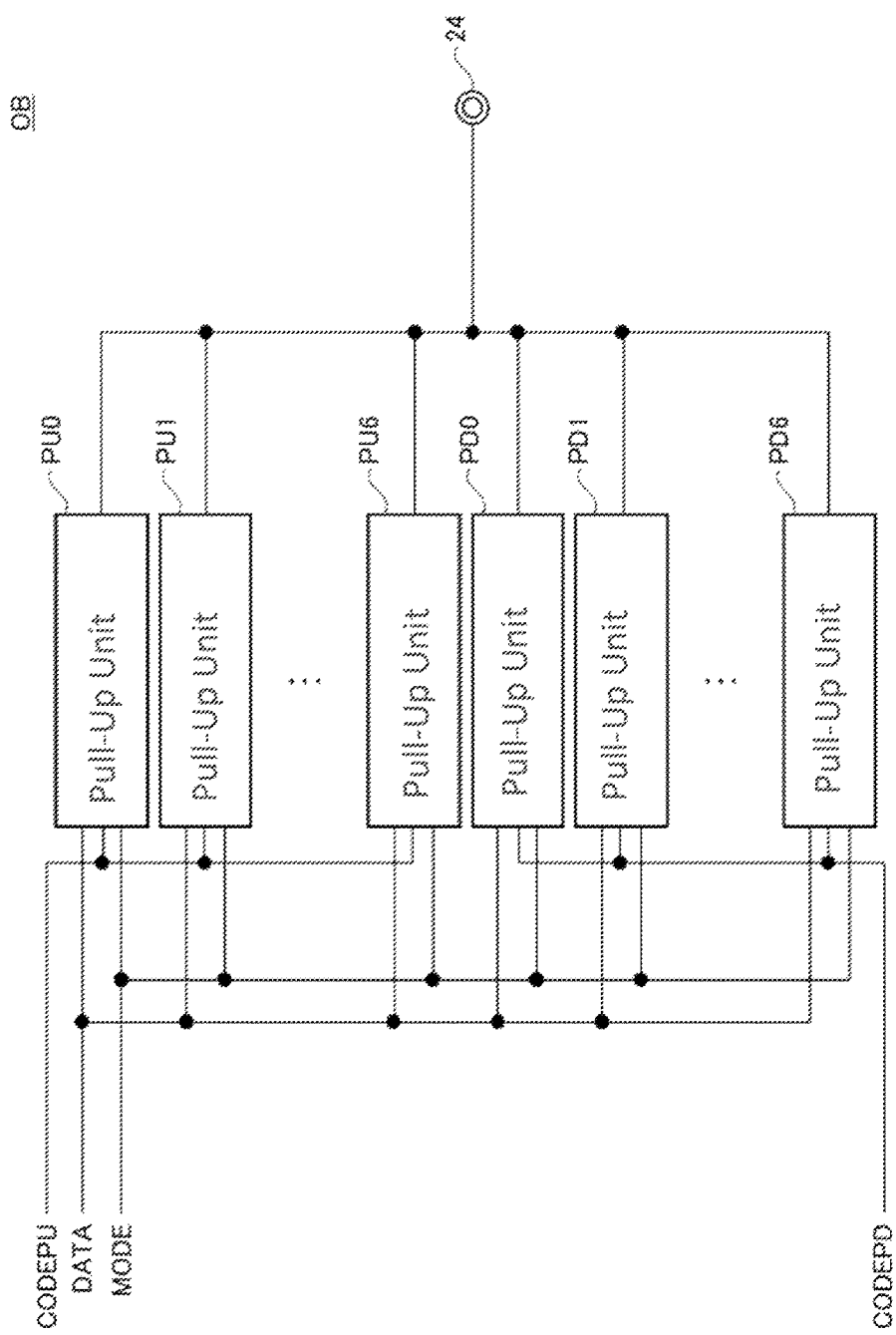
FIG. 3 is a block diagram showing a configuration of an output buffer included in a data input/output circuit, which depicts a portion that is assigned to one of data input/output terminals.

FIG. 3 is a block diagram showing a configuration of an output buffer OB included in the data input/output circuit 40, which shows a portion assigned to one of data input/output terminals 24.

As shown in FIG. 3, the output buffer OB includes seven pull-up units PU0 to PU6 and seven pull-down units PD0 to PD6 per each data input/output terminal 24. The output nodes of the pull-up units PU0 to PU6 and pull-down units PD0 to PD6 are commonly connected to the data input/output terminal 24. Each of the pull-up units PU0 to PU6 has the same circuit configuration, and in the case when it is not necessary to particularly distinguish from one another, they are generally referred to simply as "pull-up unit PU". In the same manner, each of the pull-down units PD0 to PD6 has the same circuit configuration, and in the case when it is not necessary to particularly distinguish from one another, they are generally referred to simply as "pull-down unit PD".

Each of the pull-up units PUi (i=0 to 6) and each of the pull-down units PDi (i=0 to 6) form a pair. Then, as to how many pairs of units to be used, it is determined by the impedance selection signal MODE outputted from the mode register 14. Moreover, inner data DATA is supplied from the main amplifier 39 to the pull-up units PU0 to PU6 and the pull-down units PD0 to PD6. In the case when the inner data DATA shows a high level, one or two or more pull-up units of the pull-up units PU0 to PU6 specified by the impedance selection signal MODE are activated so that the data input/output terminal 24 is thus driven to the high level. On the other hand, in the case when the inner data DATA shows a low level, one or two or more pull-down units of the pull-down units PD0 to PD6 specified by the impedance selection signal MODE are activated so that the data input/output terminal 24 is thus driven to the low level.

The impedance of each of the activated pull-up units PU0 to PU6 is specified by the code signal CODEPU. In the same manner, the impedance of each of the activated pull-down units PD0 to PD6 is specified by the code signal CODPD.

In the present embodiment, the impedance target value of the pull-up units PU0 to PU6 is 2RZQ, and the impedance target value of the pull-down units PD0 to PD6 is RZQ. Therefore, in the case when j-number of pairs of units are used by the impedance selection signal MODE, the impedance at the time of the high level output becomes 2RZQ/j, and the impedance at the time of the low level output becomes RZQ/j.

Figure 4:
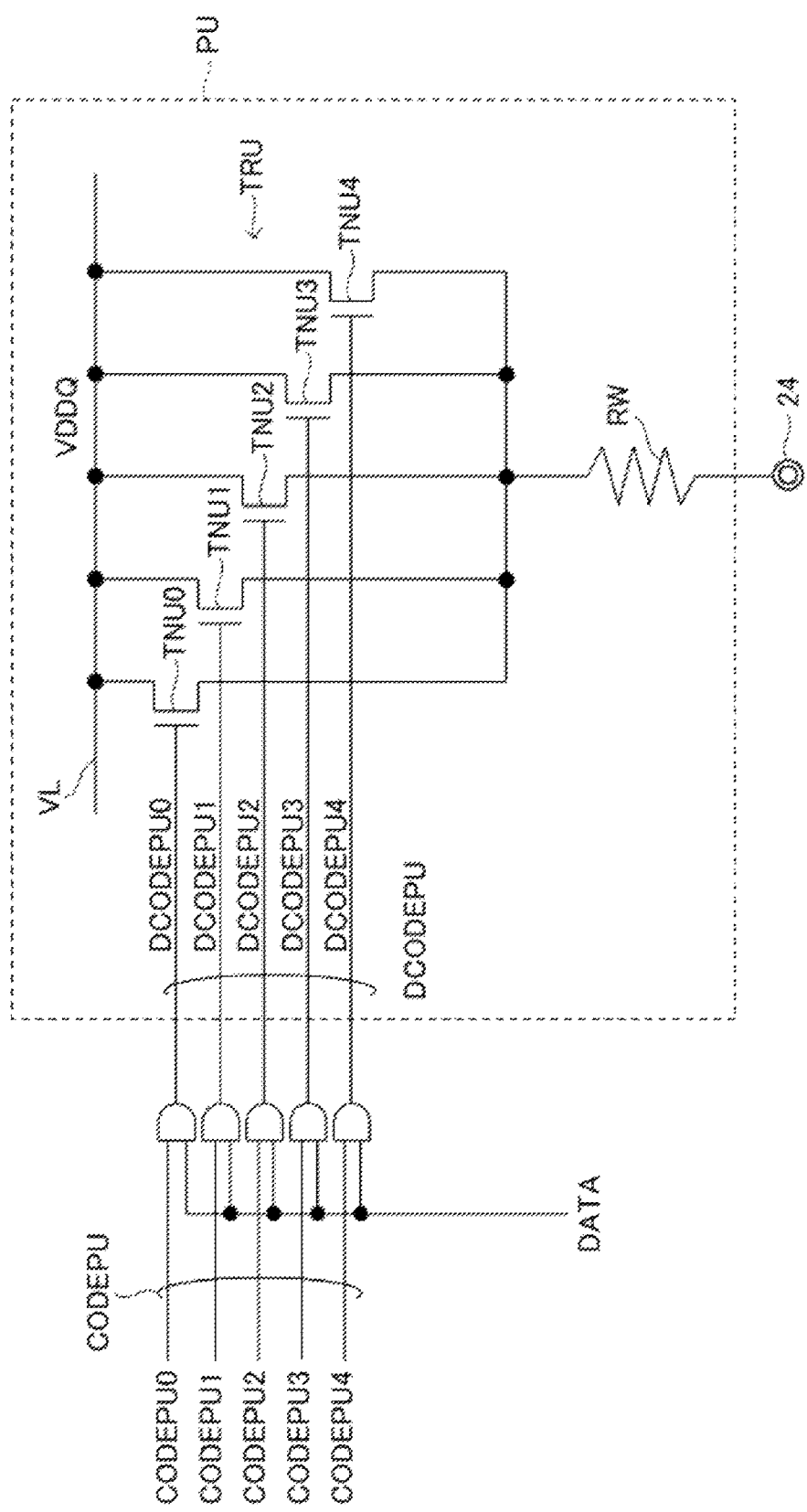
FIG. 4 is a circuit diagram showing a pull-up unit.

FIG. 4 is a circuit diagram showing the pull-up unit PU.

As shown in FIG. 4, the pull-up unit PU includes a transistor unit TRU composed of five N-channel-type MOS transistors TNU0 to TNU4 that are connected in parallel with one another and a high resistance wiring unit RW. The drains of the transistors TNU0 to TNU4 are commonly connected to a power supply wiring VL for supplying a power supply electric potential VDDQ, and the sources of the transistors TNU0 to TNU4 are connected to the data input/output terminal 24 through the high resistance wiring unit RW. The high resistance wiring unit RW forms a resistance that is made of a tungsten wire or the like, and set to, for example, about 120Ω.

Respective bits DCODEPU0 to DCODEPU4 forming a code signal DCODEPU are respectively supplied to the gate electrodes of the transistors TNU0 to TNU4, respective. Thus, the five transistors TNU0 to TNU4 are controlled so as to be individually turned on/off based upon the value of the code signal DCODEPU. As shown in FIG. 4, the code signal DCODEPU may be obtained by logically synthesizing the respective bits of the code signal CODEPU and the inner data DATA by using an AND gate circuit. Thus, in the case when the inner data DATA represents a low level, all the transistors TNU0 to TNU4 are turned off since all the bits DCODEPU0 to DCODEPU4 forming the code signal DCODEPU become the low level irrespective of the value of the code signal CODEPU. On the other hand, in the case when the inner data DATA represents a high level, since the value of the code signal CODEPU, as it is, forms the value of the code control signal DCODEPU so that some of the transistors TNU0 to TNU4 are turned on.

In this case, a ratio (W/L ratio) between the channel width (W) and the channel length (L) of the transistors TNU0 to TNU4, that is, a current supplying capability, is weighted by using a power of 2. More specifically, supposing that the W/L ratio of the transistor TNU0 is 1 WLnu, the W/L ratio of the transistor TNUk (k=0 to 4) is designed to be set to $2k$/WLnu. Thus, the impedance of the pull-up unit PU can be adjusted in 32 stages at maximum.

Figure 5:
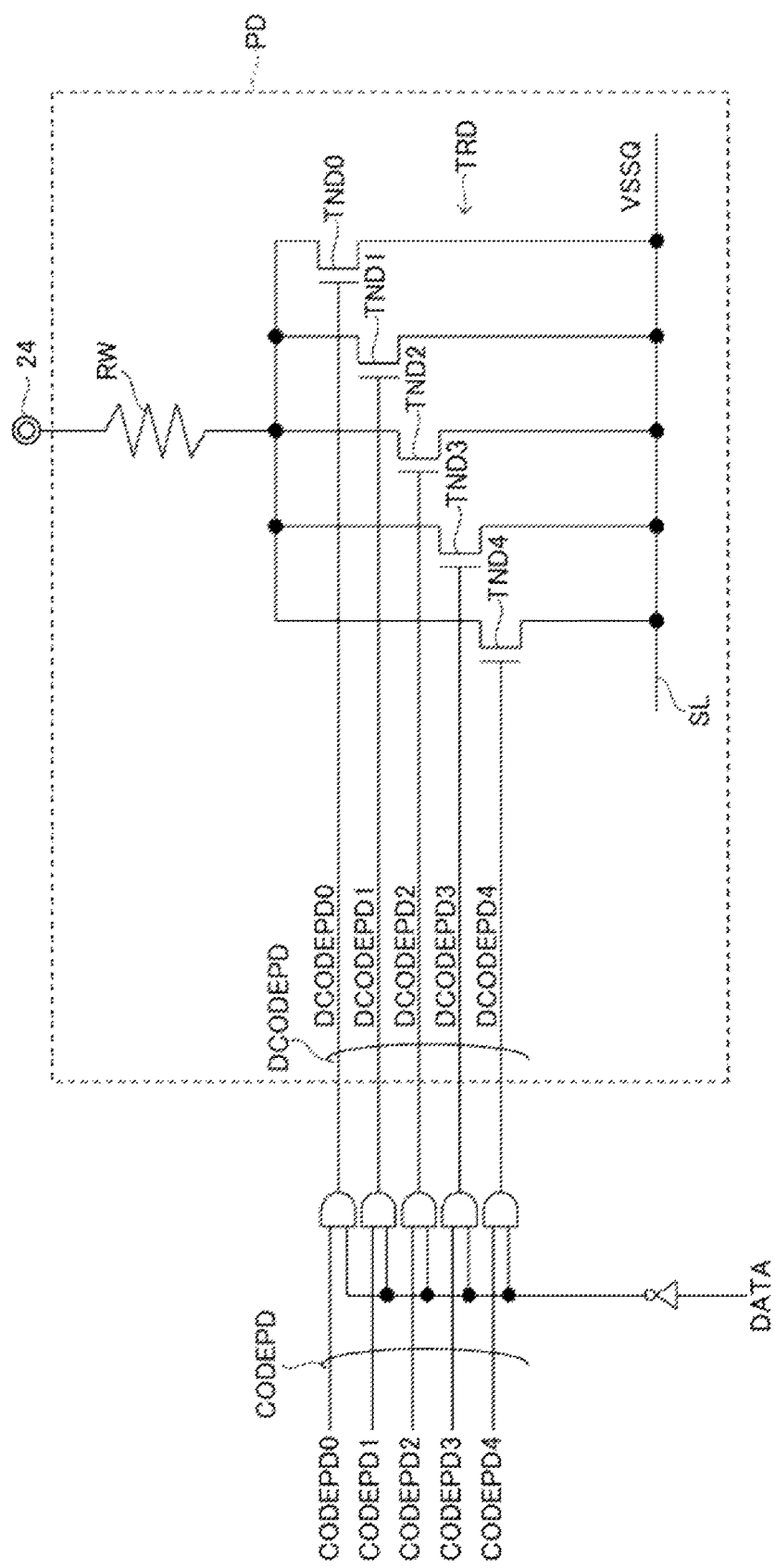
FIG. 5 is a circuit diagram showing a pull-down unit.

FIG. 5 is a circuit diagram showing the pull-down unit PD.

As shown in FIG. 5, the pull-down unit PD includes a transistor unit TRD composed of five N-channel-type MOS transistors TND0 to TND4 that are connected in parallel with one another and a high resistance wiring unit RW. The sources of the transistors TND0 to TND4 are commonly connected to a power supply wiring SL for supplying a ground electric potential VSSQ, and the drains of the transistors TND0 to TND4 are connected to the data input/output terminal 24 through the high resistance wiring unit RW.

The respective bits DCODEPD0 to DCODEPD4 forming a code signal DCODEPD are respectively supplied to the gate electrodes of the transistors TND0 to TND4. Thus, the five transistors TND0 to TND4 are controlled so as to be individually turned on/off based upon the value of the code signal DCODEPD. As shown in FIG. 5, the code signal DCODEPD may be obtained by logically synthesizing the respective bits of the code signal CODEPD and the inversion signal of the inner data DATA by using an AND gate circuit. Thus, in the case when the inner data DATA represents a high level, all the transistors TND0 to TND4 are turned off since all the bits DCODEPD0 to DCODEPD4 forming the code signal DCODEPD become the low level irrespective of the value of the code signal CODEPD. On the other hand, in the case when the inner data DATA represents a low level, since the value of the code signal CODEPD, as it is, forms the value of the code signal DCODEPD so that some of the transistors TND0 to TND4 are turned on.

In this case, a ratio (W/L ratio) between the channel width (W) and the channel length (L) of the transistors TND0 to TND4, that is, a current supplying capability, is weighted by using a power of 2. More specifically supposing that the W/L ratio of the transistor TND0 is 1 WLnd, the W/L ratio of the transistor TNDk (k=0 to 4) is designed to be set to $2k \times$WLnd. Thus, the impedance of the pull-down unit PD can also be adjusted in 32 stages.

In this manner, the impedance of the pull-up units PU and the pull-down units PD can be respectively adjusted by the code signals CODEPU and CODEPD. The code signals CODEPU and CODEPD form an impedance code ZQCODE and are generated by the calibration operation by the calibration circuit 41 indicated y FIG. 1.

Figure 6:
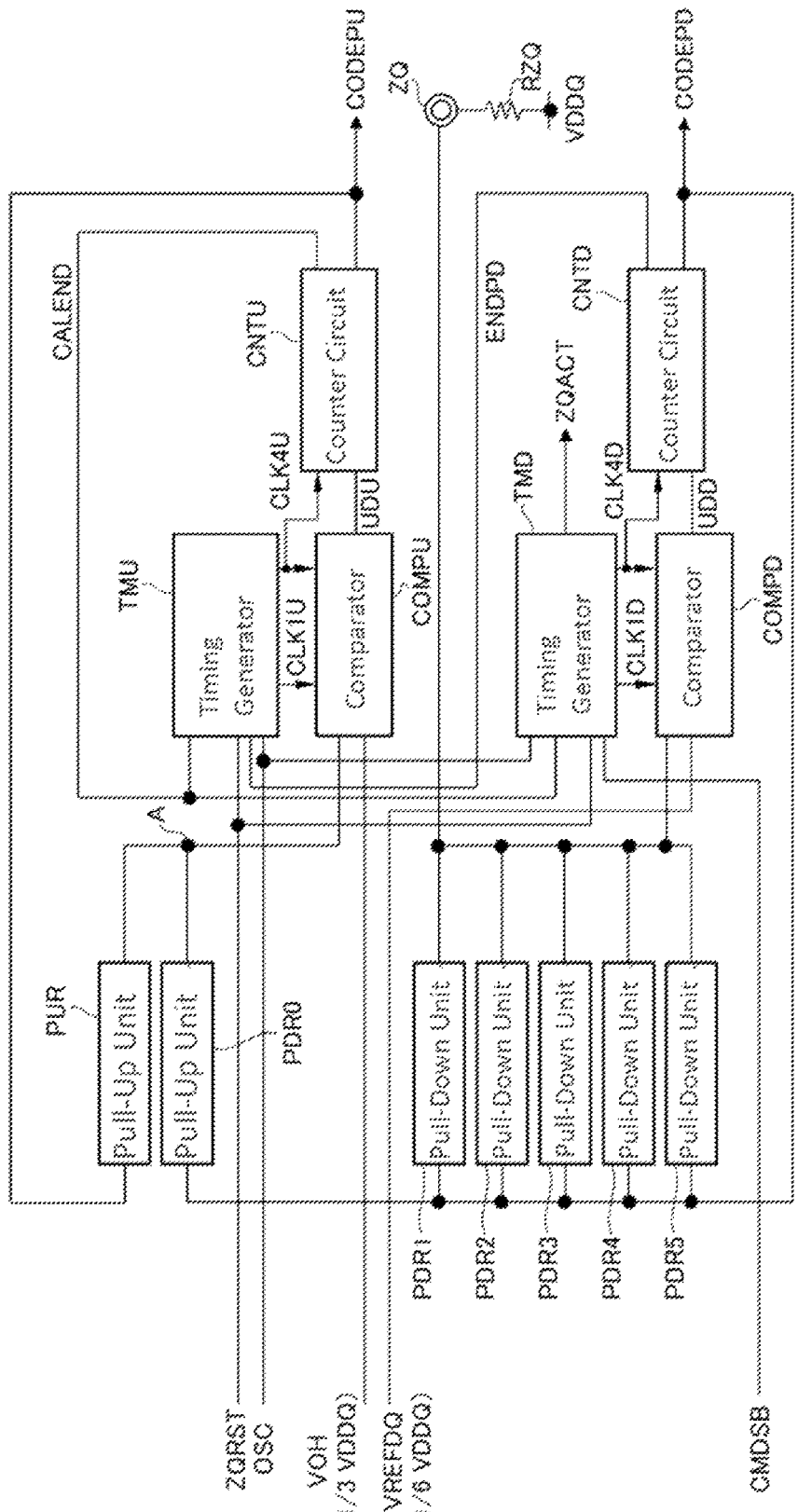
FIG. 6 is a block diagram showing a calibration circuit.

FIG. 6 is a block diagram showing the calibration circuit 41.

As shown in FIG. 6, the calibration circuit 41 includes a pull-up unit PUR corresponding to a replica unit of the pull-up unit PU and pull-down units PDR0 to PDR5 corresponding to replica units of the pull-down unit PD. The pull-up unit PUR is an output unit having the same circuit configuration as that of the pull-up unit PU, and its impedance is controlled by the code signal CODEPU. In the same manner, each of the pull-down units PDR0 to PDR5 is an output unit having the same circuit configuration as that of the pull-down unit PD, and its impedance is controlled by the code signal CODEPD.

As shown in FIG. 6, the output nodes of the pull-down units PDR1 to PUR5 are commonly connected to the calibration terminal ZQ, and also connected to a comparison circuit COMPD. The comparison circuit COMPD compares the electric potential VZQ of the calibration terminal ZQ with the reference electric potential VREFDQ, and based upon the results, generates an up/down signal UDD serving as a determination signal. The up/down signal UDD is supplied to the counter circuit CNTD, and based upon this signal, a code signal CODEPD that is the count value of the counter circuit CNTD is counted up or counted down.

The comparison circuit COMPD and the counter circuit CNTD are operated in synchronism with clock signals CLK1D and CLK4D outputted from the timing generation circuit TMD. Although the detailed description thereof will be given later, the timing generation circuit TMD generates clock signals CLK1D and CLK4D in synchronism with an oscillator clock signal OSC supplied from the oscillator 42, and also generates a calibration state signal ZQACT.

Moreover, the output nodes of the pull-up unit PUR and the pull-down unit PDR0 are connected to a connection point A. The connection point A is connected to the comparison circuit COMPU. The comparison circuit COMPU compares the electric potential of the connection point A with the reference electric potential VOH, and based upon the results, generates an up/down signal UDU serving as a determination signal. The up/down signal UDU is supplied to the counter circuit CNTU, and based upon this signal, a code signal CODEPU that is the count value of the counter circuit CNTU is counted up or counted down.

The comparison circuit COMPU and the counter circuit CNTU are operated in synchronism with clock signals CLK1U and CLK4U outputted from a timing generation circuit TMU. The timing generation circuit TMU generates clock signals CLK1U and CLK4U in synchronism with the oscillator clock signal OSC supplied from the oscillator 42.

The calibration operation is carried out in the following sequence of processes.

First, when the calibration signal CMDSB is activated, the timing generation circuit TMD is activated so that the clock signals CLK1D and CLK4D are periodically generated. In response to these, the comparison circuit COMPD is activated so that the electric potential of the calibration terminal ZQ and the electric potential of the reference electric potential VREFDQ are compared with each other. In the case when as a result, the electric potential of the calibration terminal ZQ is lower than the electric potential of the reference voltage VREFDQ, the counter circuit CNTD is counted down by using the up/down signal UDD so that the value of the code signal ODEPD is reduced. Thus, since the impedance of the pull-down units PDR1 to PDR5 becomes high by this process, the electric potential of the calibration terminal ZQ is raised. In contrast, in the case when the electric potential of the calibration terminal ZQ is higher than the electric potential of the reference voltage VREFDQ, the counter circuit CNTD is counted up by using the up/down signal UDD so that the value of the code signal ODEPD is raised. The counting up and counting down of the counter circuit CNTD are carried out in synchronism with the clock signal CLK4D. Thus, since the impedance of the pull-down units PDR1 to PDR5 becomes low by this process, the electric potential of the calibration terminal ZQ is lowered.

By repeating these operations in synchronism with the clock signals CLK1D and CLK4D, the electric potential of the calibration terminal ZQ is made substantially equal to the reference electric potential VREFDQ. In this case, the level of the reference electric potential VREFDQ is set to VDDQ/6, and to the calibration terminal ZQ, five pull-down units PDR1 to PDR5 are connected in parallel with one another; therefore, when the electric potential of the calibration terminal ZQ is brought into a substantially equal state with the reference electric potential VREFDQ, each of the pull-down units PDR1 to PDR5 is also adjusted to the same resistance value (RZQ) as that of the reference resistance element RZQ. Additionally, the impedance of the pull-down unit PDR0 is also adjusted to the value RZQ.

Upon completion of the calibration operations of the pull-down units PDR1 to PDR5, an end signal ENDPDB is outputted from the counter circuit CNTD, and a calibration operation of the pull-up unit PUR is successively started.

When the end signal ENDPDB is activated, the timing generation circuit TMU is activated so that clock signals CLK1U and CLK4U are periodically generated. In response to these, the comparison circuit COMPU is activated so that the electric potential of the connection point A and the electric potential of the reference electric potential VOH are compared with each other. In the case when as a result, the electric potential of the connection point A is higher than the reference electric potential VOH, the counter circuit CNTU is counted down by using the up/down signal UDU so that the value of the code signal CODEPD is reduced. Thus, since the impedance of the pull-up unit PUR becomes high by this process, the electric potential of the connection point A is lowered. In contrast, in the case when the electric potential of the connection point A is lower than the electric potential of the reference electric potential VOH, the counter circuit CNTU is counted up by using the up/down signal UDU so that the value of the code signal CODEPU is raised. Since the impedance of the pull-up unit PUR becomes low by this process, the electric potential of the connection point A is raised.

By repeating these operations in synchronism with the clock signals CLK1U and CLK4U, the electric potential of the connection point A is made substantially equal to the reference electric potential VOH. In this case, the level of the reference electric potential VOH is set to VDDQ/3 and the impedance of the pull-down unit PDR0 is already adjusted to RZQ, therefore, when the electric potential of the connection point A is brought into a substantially equal state with the reference electric potential VOH, the pull-up unit PUR is adjusted to a resistance value (2RZQ) that is two times as high as the reference resistance element RZQ.

Upon completion of the calibration operations of the pull-up unit PUR, an end signal CALEND is outputted from the counter circuit CNTU, and the timing generation circuits TMD and TMU are reset. Thus, since the calibration state signal ZQACT is inactivated, the operation of the oscillator 42 is stopped. As described above, the sequence of the calibration operations are completed.

Then, code signals CODEPU and CODEPD generated by the calibration operations are respectively supplied to the pull-up units PU0 to PU6 and the pull-down units PD0 to PD6 that form the output buffer OB. Thus, the impedance of the pull-up units PU0 to PU6 is adjusted to 2RZQ, and the impedance of the pull-down units PD0 to PD6 is adjusted to RZQ.

The updating method of the count value by using the counter circuits CNTD and CNTU is not particularly limited, and a so-called linear search method may be used, or a so-called binary search method may also be used.

Figure 7:
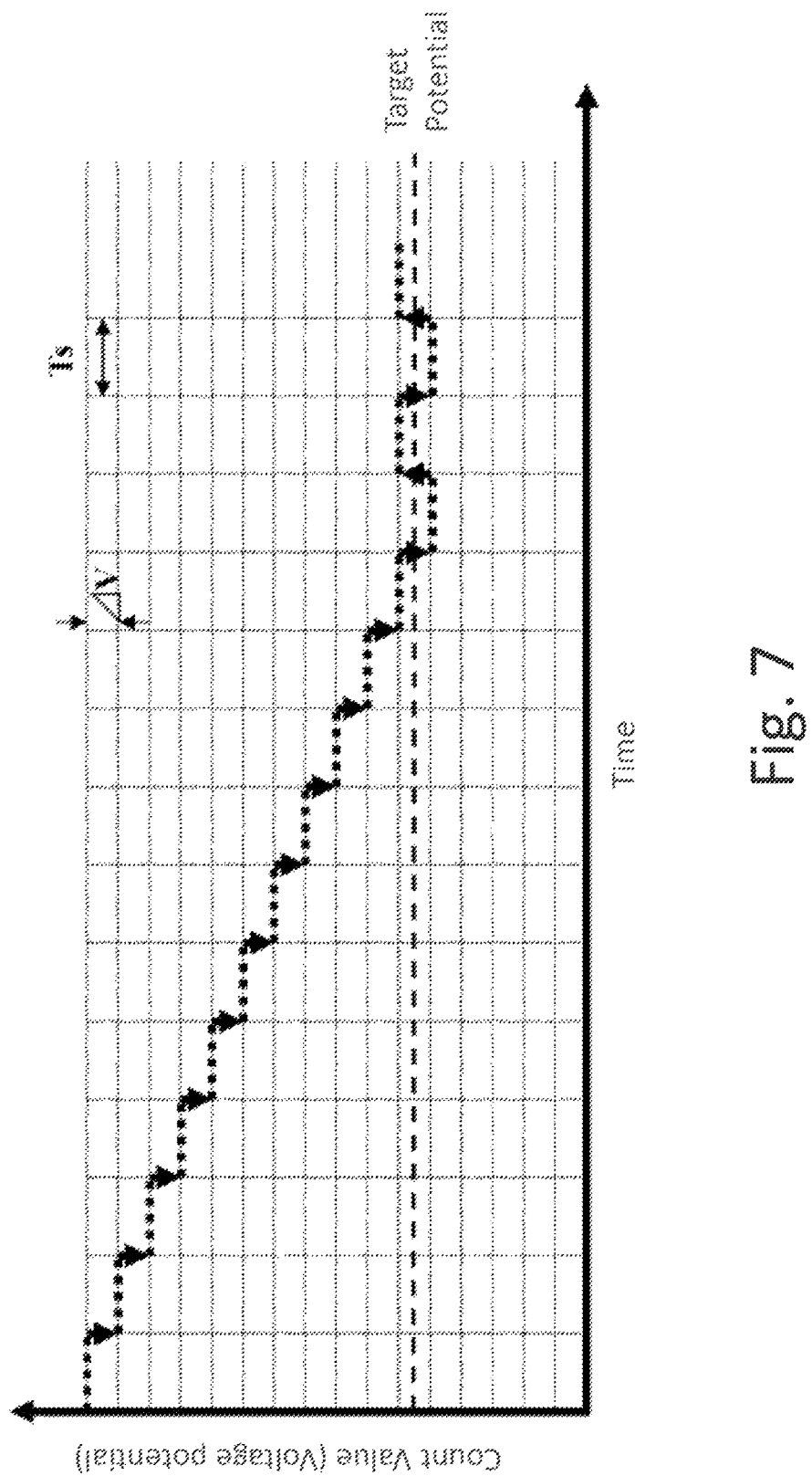
FIG. 7 is a graph showing one example of an electric potential change in a calibration terminal in the case when a linear search method is used.

The linear search method is a method for incrementing or decrementing the count value. In the case when this method is used the electric potential of the calibration terminal ZQ or the connection point A is changed with a predetermined pitch. FIG. 7 is a graph that shows one example of the electric potential change of the calibration terminal ZQ in the case of using the linear search method, which indicates that the electric potential of the calibration terminal ZQ comes closer toward VDDQ/6 that is a target electric potential by $\Delta V$ for every predetermined control period Ts. In the case of using the linear search method, the arrival time to the target electric potential becomes longer as a difference between the current electric potential and the target electric potential becomes greater; however, there is an advantage in that even if the comparison circuits COMPD and COMPU temporarily cause an erroneous determination due to influences of noise, it is possible to correctly arrive at the target electric potential by repeating correct determinations thereafter.

Figure 8:
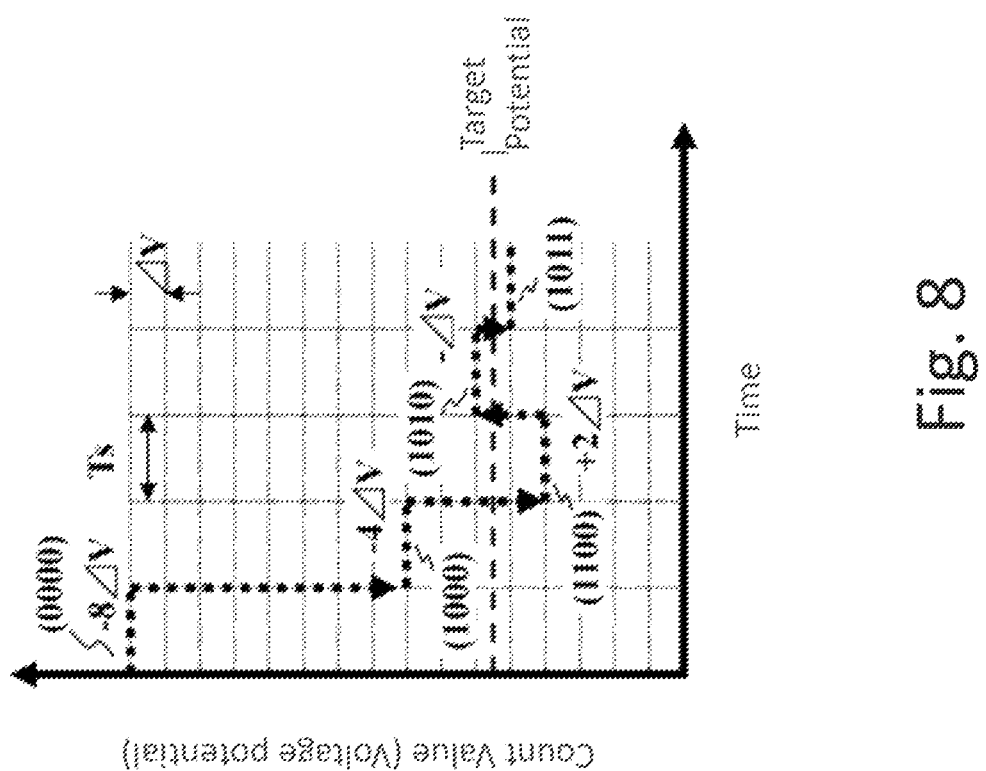
FIG. 8 is a graph showing one example of an electric potential change in the calibration terminal in the case when a binary search method is used.

On the other hand, the binary research method is a method for determining the count value from the high-order bit side. FIG. 8 is a graph that shows one example of the electric potential change of the calibration terminal ZQ in the case of using the binary search method, which indicates that when the count value is 4 bits, the calibration operations are completed by carrying out determinations of four times. In the case of the example shown in FIG. 8, the count value is started from "0000", and when the most significant bit is determined in the first determinations the electric potential VZQ of the calibration terminal ZQ is changed by $8 \times \Delta V$; when the high-order two bits are determined in the second determination, the electric potential VZQ of the calibration terminal ZQ is changed by $4 \times \Delta V$; when the high-order three bits are determined in the third determination, the electric potential VZQ of the calibration terminal ZQ is changed by $2 \times \Delta V$; and when the least significant bit is determined in the fourth determination, the electric potential VZQ of the calibration terminal ZQ is changed by $\Delta V$. In the case of using the binary search method, the arrival time to the target electric potential becomes constant irrespective of the difference between the current electric potential and the target electric potential; however, when the comparison circuits COMPD and COMPU temporarily cause an erroneous determination due to influences of noise, it becomes impossible to correctly reach the target electric potential, even if a correct determination is carried out thereafter.

Therefore, in the case when the binary search method is adopted, a circuit configuration having high noise resistance is desirably used so as to prevent the comparison circuits COMPD and COMPU front causing an erroneous determination due to influences of noise. As a typical case in which the comparison circuits COMPD and COMPU are subjected to influences of noise, a case where a reading operation or a writing operation is executed during the calibration operation is exemplified.

Figure 9:
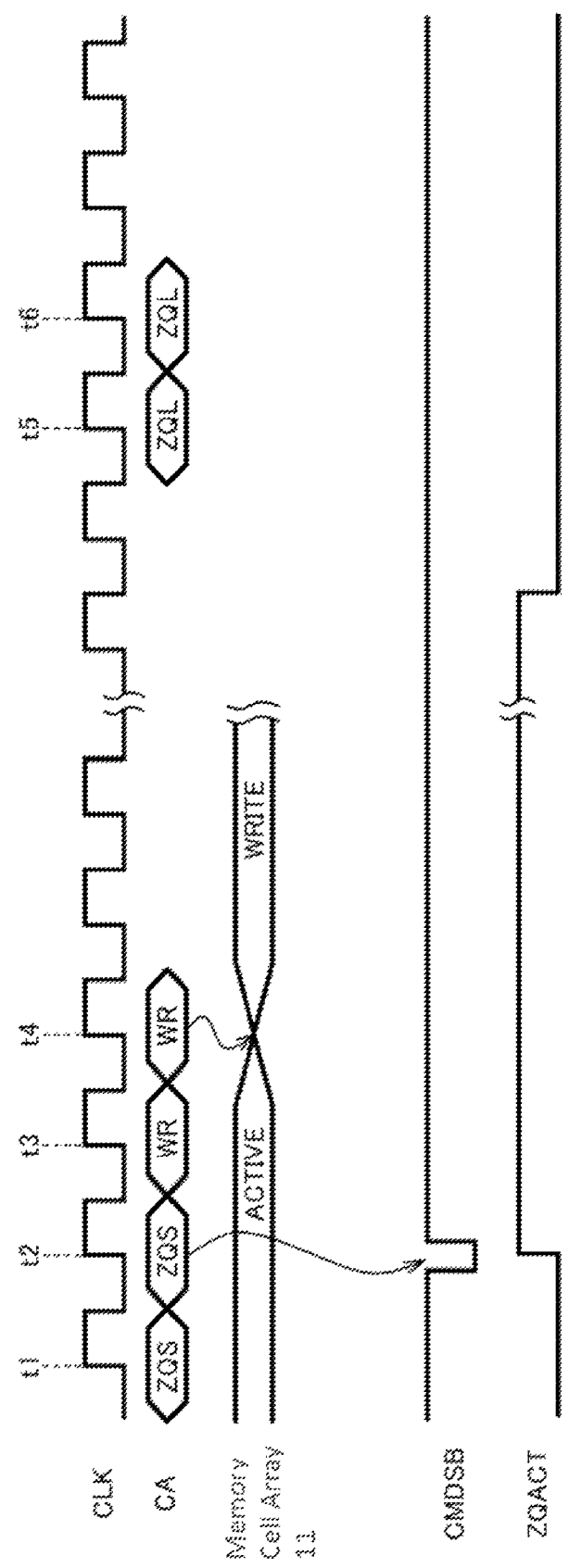
FIG. 9 is a timing chart for use in explaining a stale in which a writing operation is executed during a calibration operation.

FIG. 9 is a timing chart for use in explaining the case where a writing operation is executed during the calibration operation.

In the example of FIG. 9, a calibration command ZQS is issued at time t1 and time t2, and in response to these, the calibration signal CMDSB is activated. When the calibration signal CMDSB is activated, the calibration state signal ZQACT is set to the high level.

In the semiconductor device 10 in accordance with the present embodiment, the calibration operation can be carried out in the background, and in the example shown in FIG. 9, the calibration command ZQS is issued during a period in which the memory cell array 11 is in the active state. Moreover, at time t3 and time t4, the write command WR is issued, and in response to this, the memory cell array 11 carries out the writing operation during the calibration operation. The writing operation, is terminated before times t5 and t6, which will be described later.

When the sequence of the calibration operations by the calibration circuit 41 are completed, the calibration state signal ZQACT is inactivated so that the oscillator 42 is stopped. Thus, the value of the impedance code ZQCODE is determined. Thereafter, when an impedance code latch command ZQL is issued at time t5 and time t6, the impedance code ZQCODE is supplied to the data input/output circuit 40. As a result, the impedance of the output circuit OB included in the data input/output circuit 40 is adjusted to a level reflecting the value of the impedance code ZQCODE.

In this manner, when the reading operation, or the writing operation is executed during the calibration operation, noise caused by the reading operation and writing operation is propagated to the calibration circuit 41, with the result that the possibility of the comparison circuits COMPD and COMPU causing an erroneous determination becomes higher. Therefore, in the calibration operation to be executed in response to the calibration command, influences of noise need to be taken into consideration.

In contrast, during the calibration operation to be executed at the initial setting time after the power application, since neither reading operation nor writing operation is earned out, the necessity of having to take influences of noise into consideration becomes smaller than that in the calibration operation to be executed in response to the calibration command. The same is true tor the calibration operation in response to the reset command.

By taking the above-mentioned points into consideration, the semiconductor device 10 switches conditions of the calibration operation to be executed at the initial setting time after the power application and at the time of issuing the reset command and the calibration operation to be executed in response to the calibration command. The following description will give explanations, with these points being focused.

Figure 10:
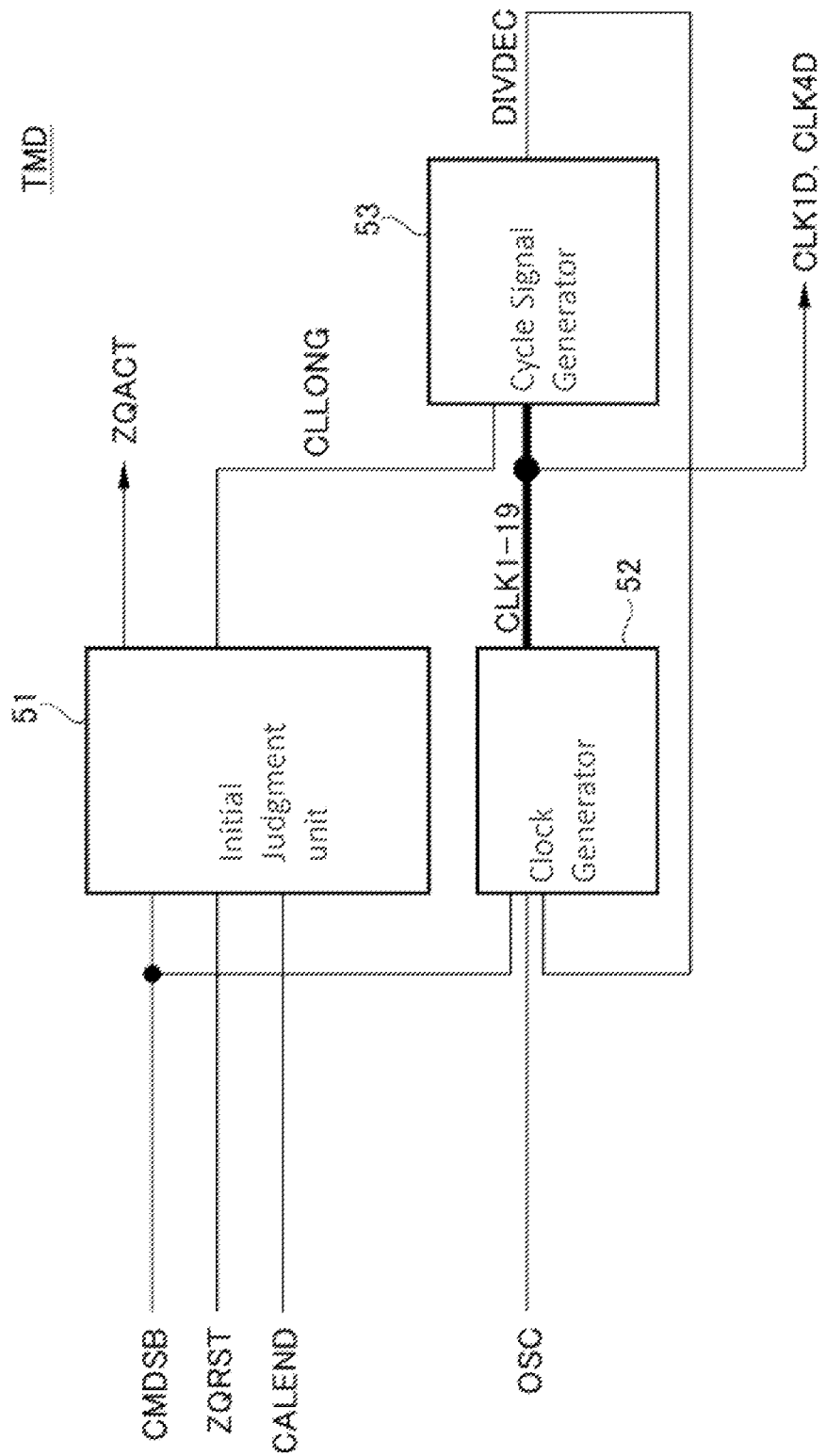
FIG. 10 is a block diagram showing a configuration of a timing generation circuit.

FIG. 10 is a block diagram showing a configuration of the timing generation circuit TMD.

As shown in FIG. 10, the timing generation circuit TMD includes an initial determination unit 51, a clock generation unit 52 and a periodic signal generation unit 53.

The initial determination unit 51 receives the calibration signal CMDSB, the reset signal ZQRST and the end signal CALEND, and generates a calibration state signal ZQACT and a status signal CLLONG. The status signal CLLONG is supplied to the periodic signal generation unit 53. Based upon some of the second clock signals CLK1 to CLK19 supplied from the clock generation unit 52 and the status signal CLLONG, the periodic signal generation unit 53 generates a periodic signal DIVDEC. The periodic signal DIVDEC is fed back to the clock generation unit 52. Moreover, of the clock signals CLK1 to CLK19 outputted from the clock generation unit 52, the clock signals CLK1D and CLK4D are supplied to the comparison circuit COMPD and the counter circuit CNTD as shown in FIG. 6.

With respect to the timing generation circuit TMU also, the end signal ENDPDB is used in place of the calibration signal CMDSB, and it has the same circuit configuration as that of the timing generation circuit TMD shown in FIG. 10 except that the generation of the calibration state signal ZQACT is not carried out. Since the clock generation unit 52 and the periodic signal generation unit 53 of the timing generation circuits TMD and TMU are integrated with each other, a configuration for reducing the current consumption may be adopted. By also inputting the calibration signal CMDSB to the timing generation circuit TMU, such a configuration as to simultaneously execute calibrations on both of the pull-up side and pull-down side may be adopted.

Figure 11:
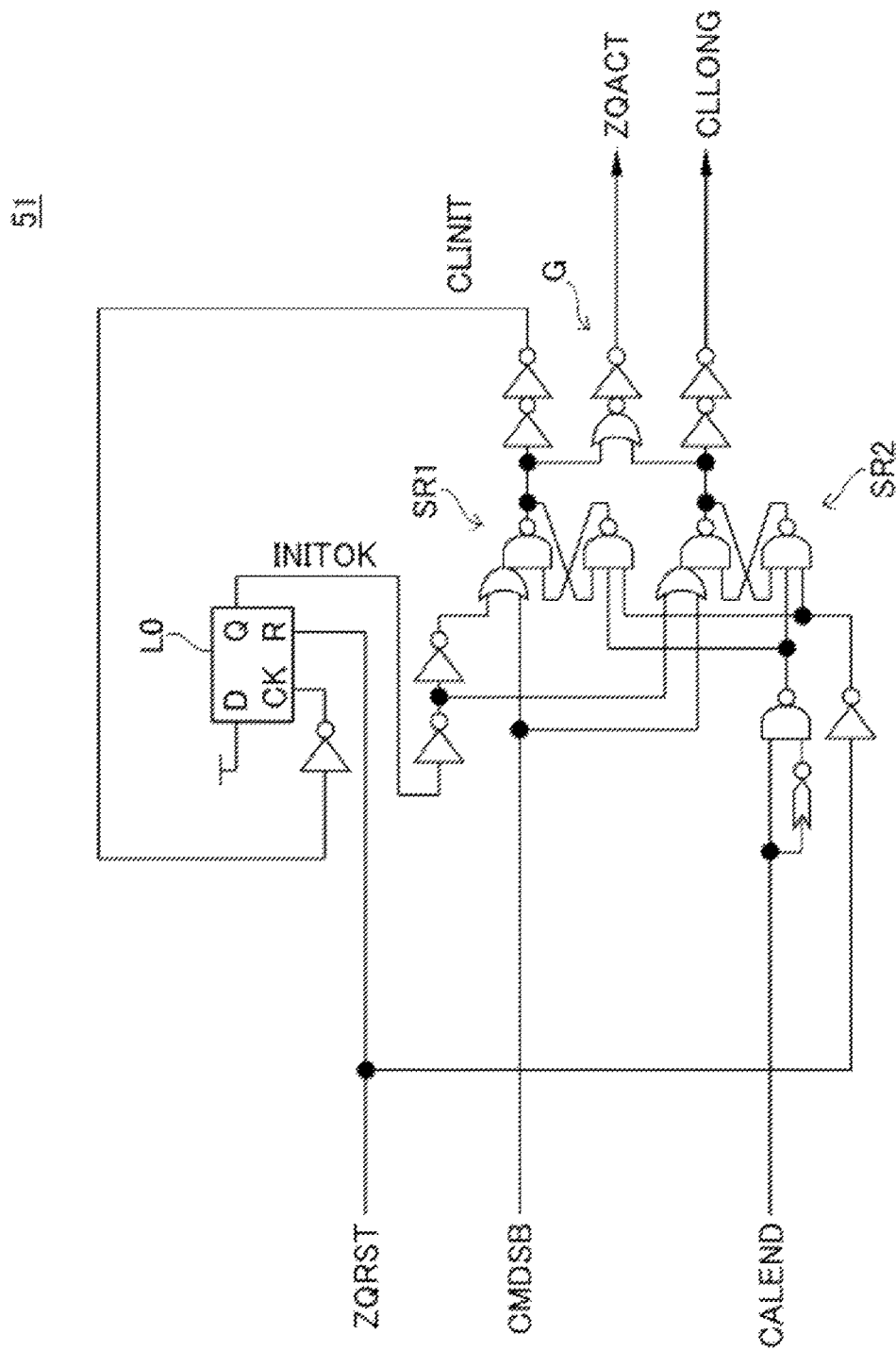
FIG. 11 is a circuit diagram of an initial determination unit.

FIG. 11 is a circuit diagram showing the initial determination unit 51.

As shown in FIG. 11, the initial determination unit 51 includes two SR (set/reset) latch circuits SR1 and SR2 and a latch circuit L0 for use in selecting either one of the latch circuits SR1 and SR2. The output signal of the latch circuit SR1 is outputted as an initial signal CLINIT, and the output signal of the latch circuit SR2 is outputted as a status signal CLLONG. The initial, signal CLINIT and the status signal CLLONG are logically synthesized by an OR gate circuit G and outputted as the calibration state signal ZQACT.

The latch circuit L0 latches high level data in synchronism with the tailing edge of the initial signal CLINIT, and a selection signal INITOK serving as its output signal is supplied to the latch circuits SR1 and SR2. Since the latch circuit L0 is reset by the reset signal ZQRST, the selection signal INIOK becomes the low level when the reset signal ZQRST is activated, and when the initial signal CLINIT falls down thereafter, the selection signal INITOK changes to the high level. In the case when the selection signal INITOK has been once changed to the high level, the selection signal INITOK maintains the high level until the reset signal ZQRST has been activated.

During the period in which the selection signal INITOK is kept in the low level, the latch circuit SR1 is selected. In the case when the latch circuit SR1 is selected, if the calibration signal CMDSB is activated to the low level, the latch circuit SR1 is set so that the initial signal CLINIT (and the calibration state signal ZQACT) subsequently becomes the high level. Thereafter, when the end signal CALEND rises up, the latch circuit SR1 is reset so that the initial signal CLINIT (and the calibration state signal ZQACT) returns to the low level.

As described above, when the initial signal CLINIT changes from the high level to the low level, the selection signal INITOK outputted from the latch circuit L0 is changed to the high level.

During a period in which the selection signal INITOK is kept in the high level, the latch circuit SR2 is selected. In the case when the latch circuit SR2 is selected, if the calibration signal CMDSB is activated to the low level, the latch circuit SR2 is set so that the status signal CLLONG (and the calibration state signal ZQACT) subsequently becomes the high level. Thereafter, when the end signal CALEND rises up, the latch circuit SR2 is reset so that the status signal CLLONG (and the calibration state signal ZQACT) returns to the low level.

By carrying out these operations, upon the first arrival of the calibration signal CMDSB after the activation of the reset signal ZQRST, the status signal CLLONG becomes the low level, while upon the second arrival and thereafter of the calibration signal CMDSB, the status signal CLLONG becomes the high level. In this case, the first arrival of the calibration signal CMDSB is made in response to a power application or the issue of a reset command, and the second arrival of the calibration signal CMDSB is made in response to the issue of the calibration command.

Figure 12:
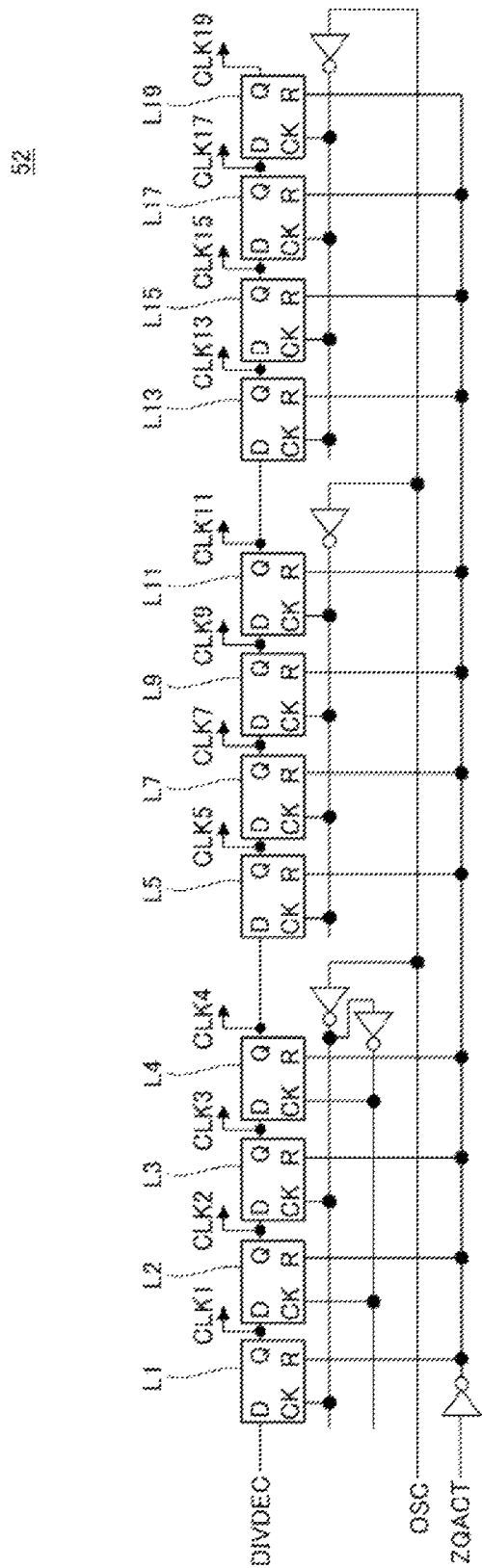
FIG. 12 is a circuit diagram of a clock signal generation unit.

FIG. 12 is a circuit diagram showing the clock generation unit 52.

As shown in FIG. 12, the clock generation unit 52 includes a shift register composed of a plurality of latch circuits L1 to L5, L7, L9, L11, L13, L15, L17 and L19 that are longitudinally connected to one after another. To the latch circuit L1 on the initial stage, the periodic signal DIVDEC is inputted. Then, the latch circuits outputs clock signals CLK1 to CLK5, CLK7, CLK9, CLK11, CLK13, CLK15, CLK17 and CLK19.

The latch circuits L1 to L4 carry out shifting operations at a ½ cycle of the oscillator clock signal OSC, while the otter latch circuits L5, L7, L9, L11, L13, L15, L17 and L19 carry out shifting operations at one cycle of the oscillator clock signal OSC. In this case, the reason that the latch circuits L1 to L4 are designed to carry out shifting operations at the ½ cycle of the oscillator clock signal OSC is because by further reducing the phase difference of the clock signals CLK1 to CLK4, fine adjustments can be easily carried out on the designing stage.

These latch circuits are reset during a period in which the calibration state signal ZQACT is inactivated to the low level. Then, upon activation of the calibration state signal ZQACT to the high level, a shifting operation of the periodic signal DIVDEC is carried out in synchronism with the oscillator clock signal OSC.

Figure 13:
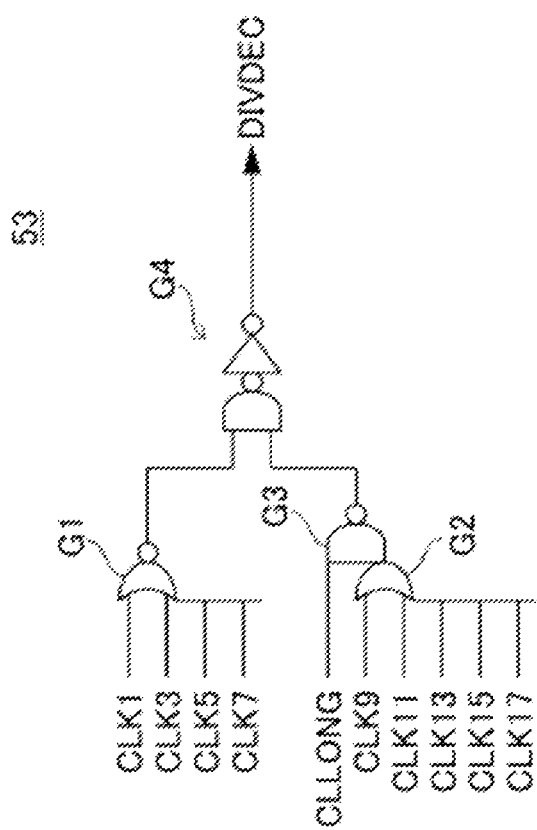
FIG. 13 is a circuit diagram of a periodic signal generation unit.

FIG. 13 is a circuit diagram showing the periodic signal generation unit 53.

As shown in FIG. 13, the periodic signal generation unit 53 includes an OR gate circuit G1 for receiving the clock signals CLK1, CLK3, CLK5 and CLK7 and an OR gate circuit G2 for receiving the clock signals CLK9, CLK11, CLK13, CLK15 and CLK17. The output signal and the status signal CLLONG of the OR gate circuit G2 are supplied to a NAND gate circuit G3. Then, the output signals from the OR gate circuit G1 and the NAND gate circuit G3 are supplied to an AND gate circuit G4, and its output signal is used as the periodic signal DIVDEC.

With such a configuration, since in the case when the status signal CLLONG is in the low level, the output signal of the NAND gate circuit G3 is fixed to the high level, the periodic signal DIVDEC is activated to the high level when all the clock signals CLK1, CLK3, CLK5 and CLK7 are set to the low level. In this case, the generation period of the periodic signal DIVDEC corresponding to a control period Ts is set to a first period (T1).

On the other hand, in the case when the status signal CLLOG is in the high level, the periodic signal DIVDEC is activated to the high level when all the clock signals CLK1, CLK3, CLK5, CLK7, CLK9, CLK11, CLK13, CLK15 and CLK17 are set to the low level. In this case, the generation period of the periodic signal DIVDEC corresponding to the control period Ts becomes a second period (T2) that is longer than the first period.

Figure 14:
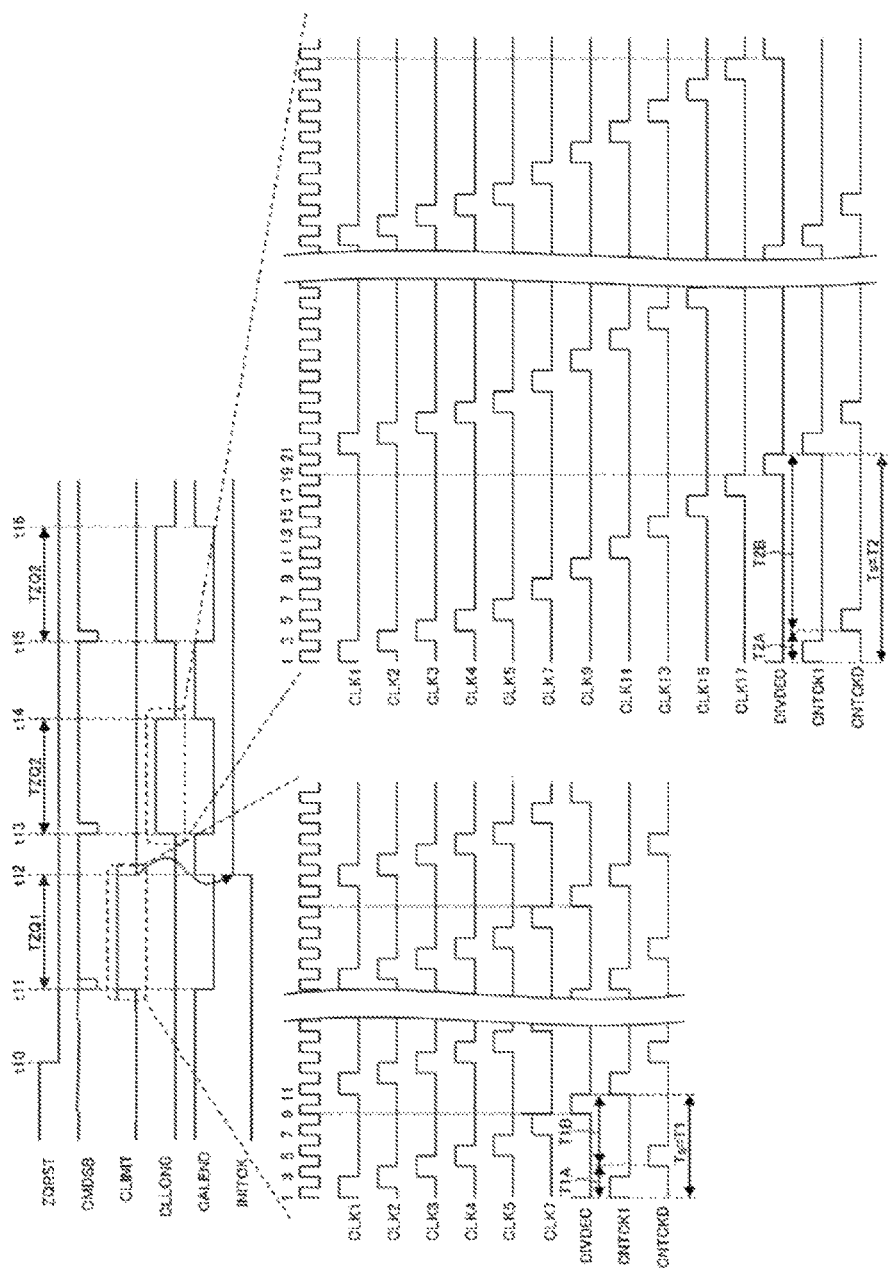
FIG. 14 is a timing chart for use in explaining operations of a calibration circuit.

FIG. 14 is a timing chart for use in explaining operations of the calibration circuit 41.

In an example shown in FIG. 14, prior to time t10, the power application or the issue of a reset command has been carried out so that the reset signal ZQRST is subsequently activated to the high level. Thereafter, at time t10, the reset signal ZQRST is changed to the low level, and moreover, at time t11, the calibration signal CMDSB is activated. The activation of the calibration signal CMDSB at time t11 is executed in response not to the issue of the calibration command, but to the power application or the issue of the reset command.

Since the activation of the calibration signal CMDSB at time t11 is the first activation after the reset signal ZQRST has been cancelled, the initial signal CLINIT is activated while the status signal CLLONG is not activated. For this reason, the periodic signal generation unit 53, shown in FIG. 13, generates the periodic signal DIVDEC with a relatively short first period. In this case, when all the clock signals CLK1, CLK3, CLK5 and CLK7 become the low level the periodic signal DIVDEC is activated to the high level; therefore, the generation period T1 of the periodic signal DIVDEC corresponds to 5 cycles of the oscillator clock signal OSC. That is, 5 cycles of the oscillator clock signal OSC form the control period Ts.

During a period in which the periodic signal DIVDEC is generated at the first period, clock signals CLK1D, CLK4D (CLK1U, CLK4U) are extracted, and operations of the comparison circuit COMPD (COMPU) and the counter circuit CNTD (CNTU) are controlled. Thereafter, when the end signal CALEND becomes the high level at time t12, the sequence of calibration operations are completed.

In this case, neither a read command nor a write command is applied during this period since TZQ1 corresponding to a sequence of calibration operation periods is one portion of the initial setting operation period. For this reason, the occurrence of noise in the calibration circuit 41 is relatively small.

Thereafter, a calibration command is externally issued, the calibration signal CMDSB is again activated at time t13 so that the calibration operations are executed. Since the activation of the calibration signal CMDSB at time t13 is an activation of the second time or thereafter after the reset signal ZQRST has been cancelled, the status signal CLLONG is activated. For this reason, the periodic signal generation unit 53, shown in FIG. 13, generates the periodic signal DIVDEC with a relatively long second period. In this case, the periodic signal DVDEC is activated to the high level since in the case when all the clock signals CLK1, CLK3, CLK5, CLK7, CLK9, CLK11, CLK13, CLK15 and CLK17 are set to the low level. As a result, the generation period T2 of the periodic signal DIVDEC corresponds to 10 cycles of the oscillator clock signal OSC. That is, 10 cycles of the oscillator clock signal OSC form the control period Ts.

During a period in which the periodic signal DIVDEC is generated at the second cycle, clock signals CLK1D, CLK4D (CLK1U, CLK4U) are extracted, and operations of the comparison circuit COMPD (COMPU) and the counter circuit CNTD (CNTU) are controlled. Then, the end signal CALEND becomes the high level at time t14, the sequence of calibration operations are completed. Even thereafter, in response to the calibration command, the calibration signal CMDSB is activated at time t15, and the end signal CALEND is activated at time t16.

In this case, in TZQ2 corresponding to a sequence of calibration operation periods in response to the calibration command, a read command or a write command is sometimes applied. For this reason, it can be said that the occurrence of noise in the calibration circuit 41 is relatively high.

Figure 15:
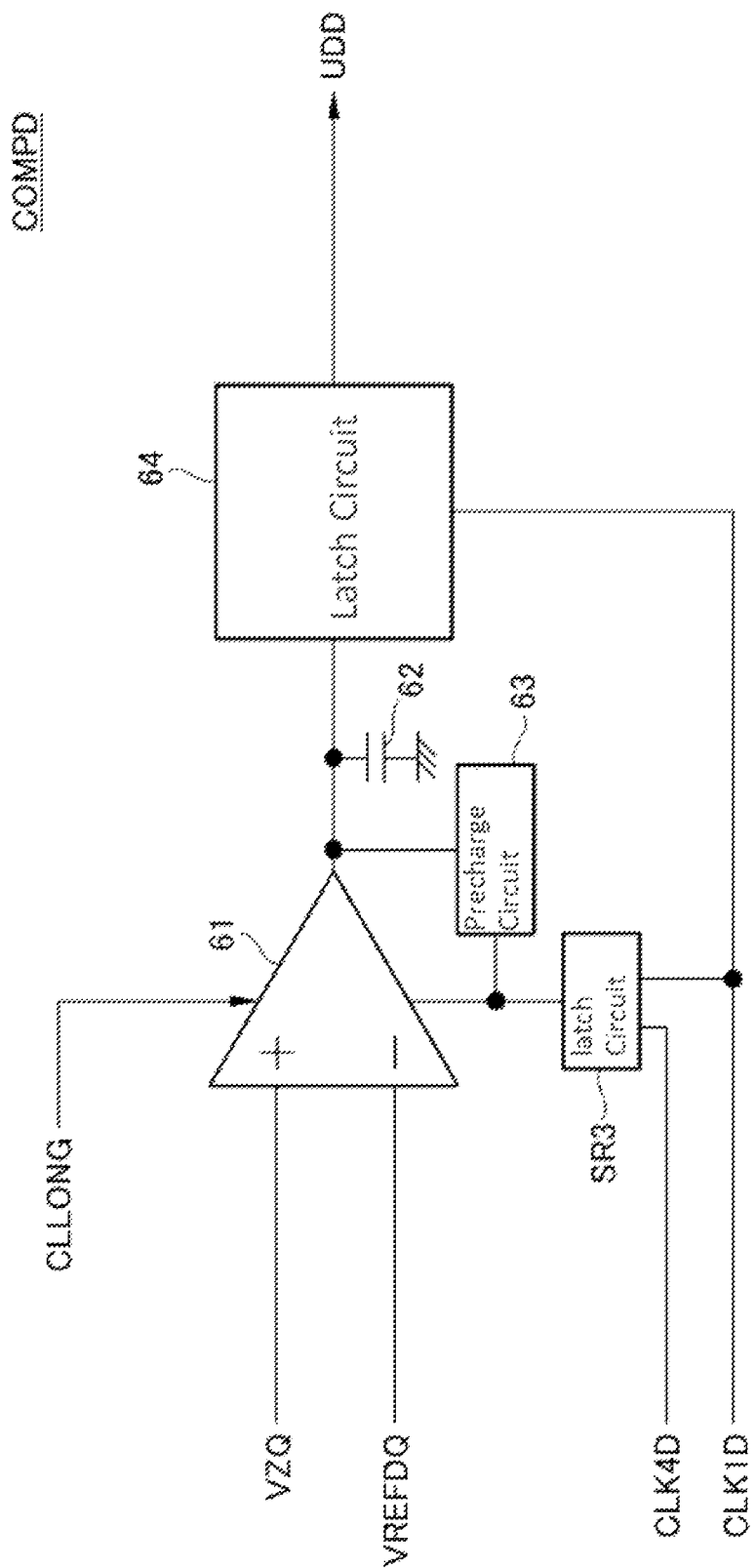
FIG. 15 is a circuit diagram of a comparison circuit in accordance with a first example.

FIG. 15 is a circuit diagram showing the comparison circuit COMPD in accordance with the first example.

The comparison circuit COMPD shown in FIG. 15 includes an amplifier 61 for use in comparing the electric potential VZQ of the calibration terminal with the reference electric potential VREFDQ and a capacitor 62 connected to the output node of the amplifier 61.

The amplifier 61 compares the electric potential VZQ of the calibration terminal with the reference electric potential VREFDQ, and based upon the electric potential difference, drives the output node so that a charging/discharging operation of the capacitor 62 is carried out. In other words, in the case when the electric potential VZQ of the calibration terminal is higher than the reference electric potential VREFDQ, the charging process of the capacitor 62 is carried out by driving the output node to the high level. In contrast, in the case when the electric potential VZQ of the calibration terminal is lower than the reference electric potential VREFDQ, the discharging process of the capacitor 62 is carried out by driving the output node to the low level.

The operations of the amplifier 61 is controlled by a latch circuit SR3. The latch circuit SR3 is an SR (set/reset) type latch circuit which is set by the clock signal CLK4D and reset by the clock signal CLK1D, and during a period in which the latch circuit SR3 is set, the amplifier 61 is activated. Thus, during a period until the clock signal CLK1D has been activated after the activation of the clock signal CLK4D, the amplifier 61 carries out a comparing operation so that a charging/discharging operation is executed on the capacitor 62. In this case, the period from the activation of the clock signal CLK4D to the activation of the clock signal CLK1D corresponds to the charging/discharging periods T1B and T2B shown in FIG. 14.

With respect to the charging level of the capacitor 62, a pre-charging process to a predetermined level is carried out by the pre-charge circuit 63. During the period in which the latch circuit SR3 is reset, the pre-charge circuit 63 pre-charges the capacitor 62 to the predetermined level. In this manner, the amplifier 61 and the pre-charge circuit 63 carry out operations exclusively.

Moreover, the charging level of the capacitor 62 is determined by the latch circuit 64, and the resulting signal is outputted as an up/down signal UDD serving as a binary signal. The latching operation by the latch circuit 64 is carried out in synchronism with the clock signal CLK1D.

Figure 16:
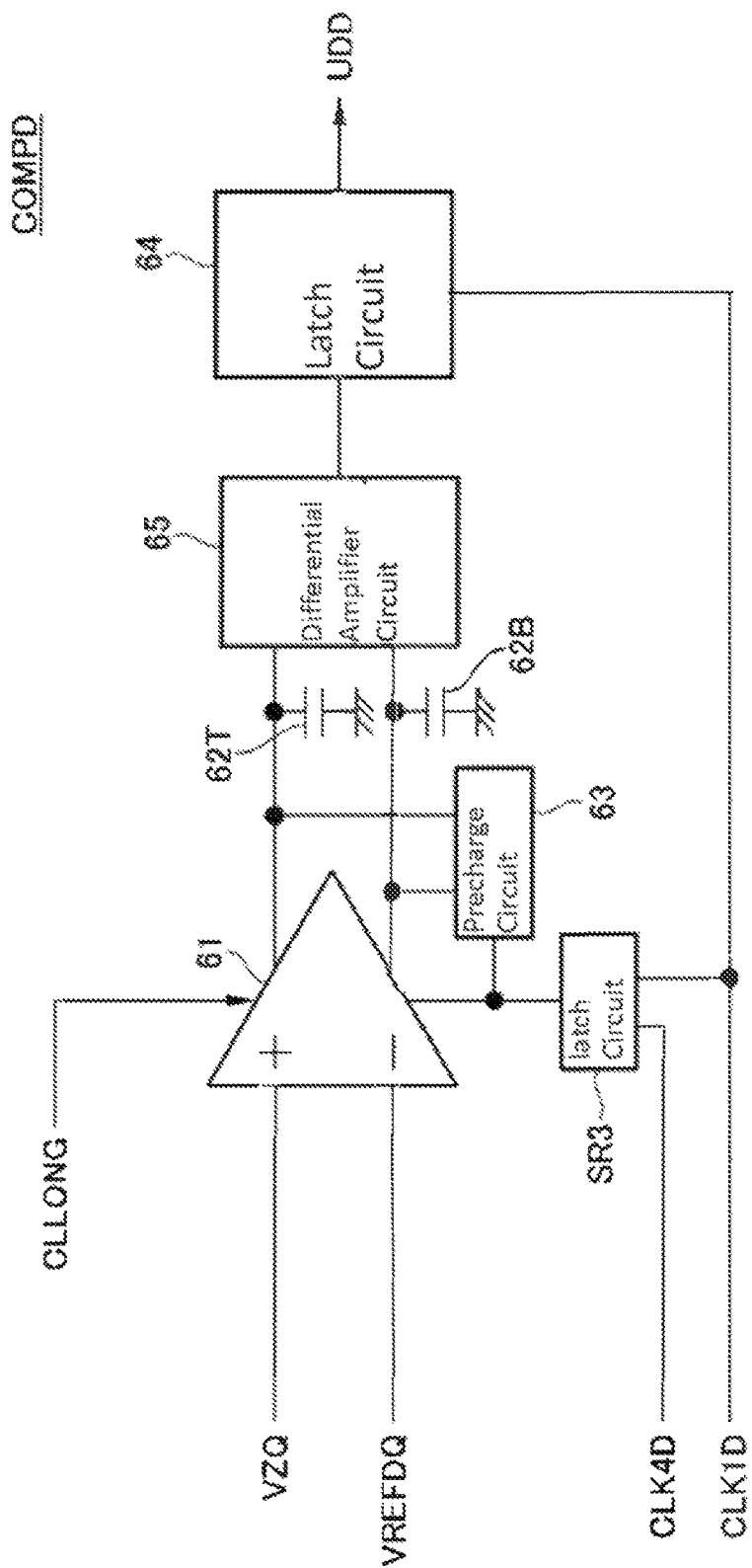
FIG. 16 is a circuit diagram of a comparison circuit in accordance with a second example.

FIG. 16 is a circuit diagram showing the comparison circuit COMPD in accordance with the second example.

In the example of FIG. 16, the amplifier 61 has two output nodes that output complementary signals, and a capacitor 62T is connected to one of the output nodes, with a capacitor 62B being connected to the other output node.

When the electric potential VZQ of the calibration terminal is higher than the reference electric potential VREFDQ, the amplifier 61 drives the one of the output nodes to the high level so that the capacitor 62T is charged, while driving the other node to the low level so that the capacitor 62B is discharged. In contrast, in the case when the electric potential VZQ of the calibration terminal is lower than the reference electric potential VREFDQ, the amplifier 61 drives the one of the output nodes to the low level so that the capacitor 62T is discharged, while driving the other node to the high level so that the capacitor 62B is charged.

Then, after having been determined by a differential amplifier circuit 65, the charged levels of the capacitors 62T and 62B are latched by the latch circuit 64, and outputted as an up/down signal UDD.

In accordance with the circuit configuration shown in FIG. 16, the electric potential difference between the electric potential VZQ of the calibration terminal and the electric potential of the reference electric potential VREFDQ can be compared with high precision.

Additionally, with respect to the comparison circuit COMPU also, the same circuit configuration as that of FIG. 15 or FIG. 16 is provided except that the amplifier 61 compares the electric potential of the connection point A with the reference electric potential VOH.

In this manner, since the comparison circuits COMPD and COMPU are dynamic comparison circuits using the capacitor 62 (62T, 62B), there is a possibility of an erroneous determination when the charged level of the capacitor 62 (62T, 62B) fluctuates due to influences of noise.

As described above, the operations of the comparison circuits COMPD and COMPU are controlled by the clock signals CLK1D and CLK4D (CLK1U and CLK4U). In this case, a period from the rising edge of the clock signal CLK1D (CLK1U) to the rising edge of the clock signal CLK4D (CLK4U) forms a period in which file capacitor 62 (62T, 62B) is pre-charged, which corresponds to the pre-charge period T1A, T2A shown in FIG. 14. The period T1A is included in a period T1 in the case of the low level of the status signal CLLONG, and the period T2A is included in a period T2 in the case of the high level of the status signal CLLONG. Since these periods T1A and T2A mutually have the same length, there is no change in the pre-charging period of the capacitor 62 (62T, 62B).

In contrast, charging/discharging periods T1B and T2B which correspond to periods from the rising edge of the clock signal CLK4D (CLK4U) to the rising edge of the clock signal. CLK1D (CLK1U) have mutually different lengths. The charging/discharging periods T1B and T2B are periods in which a charging/discharging process of the capacitor 62 (62T, 62B) is carried out by the amplifier 61, and the length is changed depending on the level of the status signal CLLONG. Moreover, the driving capability of the amplifier 61 for charging the capacitor 62 (62T, 62B) also changes depending on the status signal CLLONG. More specifically, it is designed such that in the case when the status signal CLLONG becomes the high level to change the charging period to be longer, the output resistance becomes relatively higher, with the result that the current supplying capability for driving the two output nodes becomes relatively lower. In contrast, in the case when the status signal CLLONG becomes the low level to change the charging period to be shorter, the output resistance becomes relatively lower, with the result that the current supplying capability for driving the two output nodes becomes relatively higher. By making the output resistance relatively higher in the case when the charging period is long, the function of the circuit serving as a low-pass filter can be enhanced.

More specifically, in the case when the status signal CLLONG is in the low level, that is, in the calibration operation of the first time in response to the power application or the issue of the reset command, the period T1B is set to 3.5 cycles of the oscillator clock signal OSC, which is a short period. In contrast, in the case when the status signal CLLONG is in the high level, that is, in the calibration operation of the second time or thereafter in response to the issue of a calibration command, the period T2B is set to 8.5 cycles of the oscillator clock signal OSC, which is 2.43 times as long as the period T1B.

Thus, in the calibration operation of the first time in response to the power application or the issue of the reset command, the counter circuits CNTD and CNTU can be updated more times within a predetermined calibration period. Upon power application, the electric potential of the calibration terminal ZQ and the electric potential of the connection point A tend to be widely separated from the reference electric potential VREFDQ or VOH in many cases; however, in accordance with the present embodiment, for example, even in the case of carrying out a linear searching operation, the electric potential of the calibration terminal ZQ and the electric potential of the connection point A can be adjusted correctly. Moreover, since in the calibration operation of the first time, neither a read operation nor a write operation is carried out, influences of noise are hardly caused. For this reason, even when the period T1B during which a charging/discharging operation of the capacitor 62 (62T, 62B) is carried out is short, there is hardly any possibility of an erroneous determination. Moreover, even in the case of carrying out a binary searching operation, by utilizing the fact that influences from noise are hardly caused, it becomes possible to properly carry out a high speed calibration operation.

On the other hand, in the calibration operation of the second time or thereafter in response to the issue of a calibration command, since the period T2B during which a charging/discharging operation of the capacitor 62 (62T, 62B) is carried out is set longer, it is possible to prevent an erroneous determination due to influences of noise even in the case of carrying out a read operation or a write operation during the calibration operation. For this reason, for example, even in the case of carrying out a binary searching operation, it becomes possible to prevent an erroneous adjustment from occurring by an erroneous determination. Moreover, in the calibration operation of the second time or thereafter, there are more cases in which the number of comparisons is kept less in the linear searching operation than the number in the binary searching operation; therefore, the configuration of the present embodiment is also effectively applied to the linear searching operation. That is, as to whether the linear searching method or the binary searching method should be used, it is determined based upon designing ideas, and both of the methods are included in the present invention.

As described above, when the sequence of processes is shifted from the first calibration operation in response to the power application or the issue of a reset command to the second calibration operation or thereafter in response to the issue of a calibration command, the control period Ts is switched. Thus, the comparison of electric potentials and the update of the count value can be carried out by using the control period that is optimized for each calibration operation.

Figure 17:
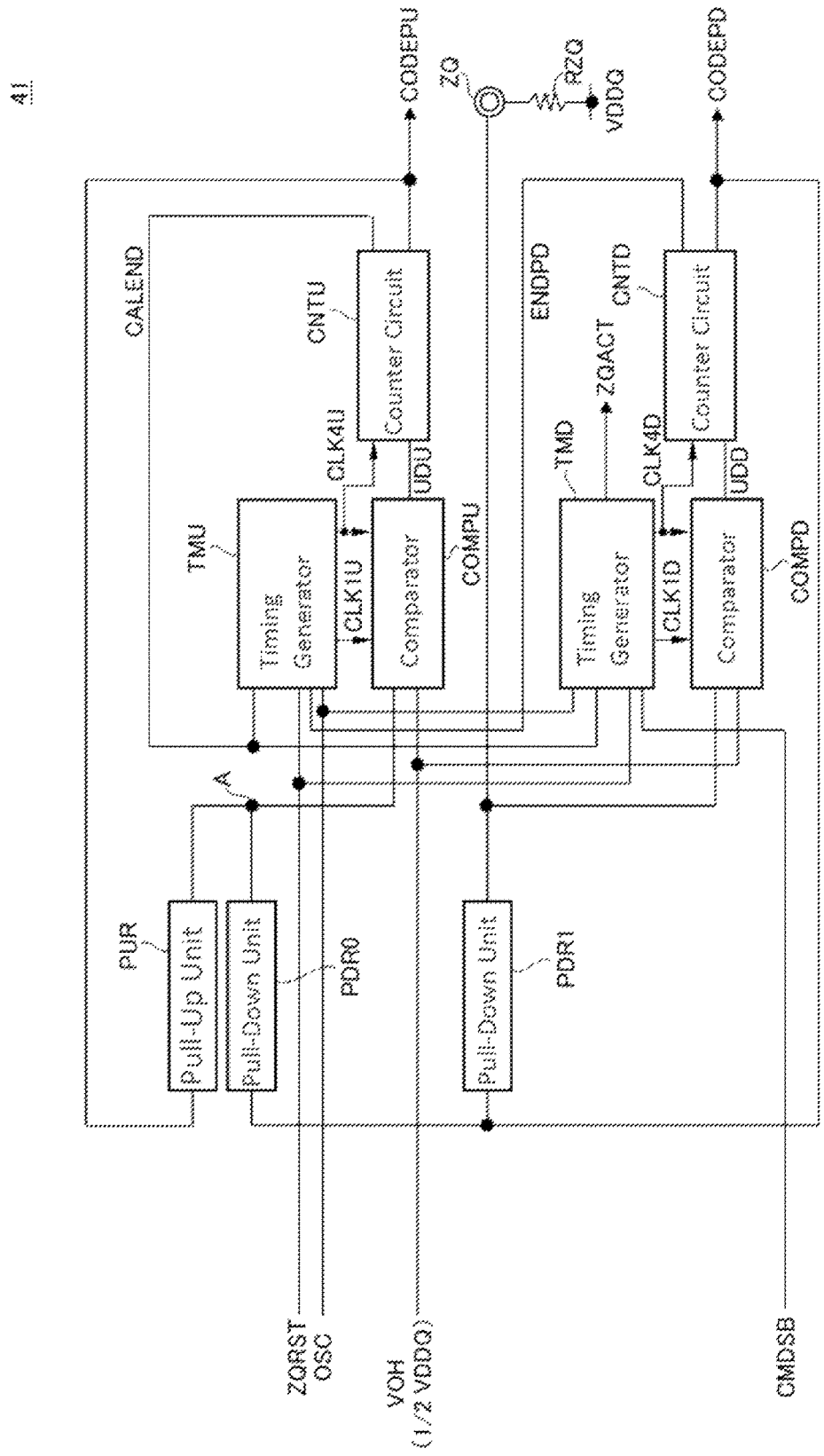
FIG. 17 is a circuit diagram of a calibration circuit in accordance with a modified example.

FIG. 17 is a circuit diagram showing a calibration circuit 41 in accordance with a modified example.

The calibration circuit 41 shown in FIG. 17 is different from the calibration circuit 41 shown in FIG. 6 in that the pull-down units PDR2 to PDR5 are omitted. Moreover, in the calibration circuit 41 shown in FIG. 17, each of the reference electric potentials VREFDQ to be supplied to the comparison circuits COMPD and COMPU is set to a ½ VDDQ level. Thus, each of the impedances of the pull-down units PDR0 and PDR1 as well, as the pull-up unit PUR is adjusted to RZQ. In the present invention, the calibration circuit 41 of this type may be used.

In the foregoing description, explanations have been given based upon the preferred embodiments of the invention; however, the present invention is not intended to be limited by the above-mentioned embodiments, and it is needless to say that various modifications may be made therein within a scope not departing from the gist of the present invention and those modifications are included in the scope of the present invention.

For example, in the above-mentioned embodiment, the control period of the calibration operation of the first time is set to 4 cycles of the oscillator clock signal OSC, and the control period of the calibration operation of the second time is set to 9 cycles of the oscillator clock signal OSC; however, these arrangements are exemplar only, and the lengths of the respective control periods may be desirably set depending on characteristics or the like that are required.

What is claimed is:

1. An apparatus, comprising:
an external terminal;
an output circuit having an impedance corresponding to a code signal;
a calibration circuit configured to produce the code signal responsive to a comparison of a voltage at the external terminal with a reference voltage, the comparison performed based, at least in part, on a periodic cycle signal with a first cycle period in a first mode that is defined by a reset signal and with a second cycle period in a second mode that is defined by a calibration signal, wherein the second cycle period is longer than the first cycle period;
a timing generator configured to produce the periodic cycle signal having the first cycle period and the second cycle period.

2. The apparatus as claimed in claim 1, wherein the comparison is performed based, at least in part, on the periodic cycle signal with the first cycle period during power-on of the apparatus, and based, at least in part, on the periodic cycle signal with the second cycle period during a time other than the power-on.

3. The apparatus as claimed in claim 2, wherein the time other than the power-on includes a time when the apparatus performs a read or write operation.

4. The apparatus as claimed in claim 1, wherein the timing generator comprises an initial judgment circuit configured to produce a signal indicating the first and second modes responsive to the reset signal and the calibration signal.

5. An apparatus, comprising:
an external terminal;
an output circuit configured to be coupled to the external terminal and have an impedance according to a value of a code signal;
a comparator configured to produce a judgment signal by comparing a voltage potential at the external terminal and a reference voltage potential;
a counter circuit configured to update the value of the code signal according to a periodic cycle signal, responsive to the judgment signal; and
a timing generator configured to produce the periodic cycle signal having a first cycle period when a status signal indicates a first status that is defined by a reset signal and the periodic cycle signal having a second cycle period when the status signal indicates a second status that is defined by a calibration signal;
wherein the comparator includes a capacitor,
wherein the judgment signal is produced responsive to a charge level of the capacitor,
wherein the capacitor is charged or discharged according to the periodic cycle signal, responsive to a voltage potential difference between the voltage potential at the external terminal and the reference voltage potential,
wherein the second cycle period corresponding to the second status of the status signal, corresponds to a discharging or charging period of the capacitor, and
wherein the first cycle period is shorter than the second cycle period.

6. The apparatus as claimed in claim 5, wherein the status signal indicates the first status during an initialization of the apparatus and indicates the second status when a calibration command is input to the apparatus after the initialization has been completed.

7. The apparatus as claimed in claim 5,
wherein the period corresponding to one cycle of the periodic cycle signal includes a first precharge period corresponding to the first status of the status signal and includes a second precharge period corresponding to the second status of the status signal, for precharging the capacitor,
wherein the first and second precharge periods are substantially equal to each other.

8. The apparatus as claimed in claim 5,
wherein the comparator includes an amplifier configured to detect a voltage potential difference between the voltage potential at the external terminal and the reference voltage potential;
wherein the capacitor is coupled to an output node of the amplifier.

9. The apparatus as claimed in claim 8,
wherein the capacitor comprises first and second capacitors,
wherein the amplifier comprises first and second output nodes outputting complementary signals,
wherein the first capacitor is coupled to the first output node, and
wherein the second capacitor is coupled to the second output node.

10. The apparatus as claimed in claim 9,
wherein the amplifier drives the first and second output nodes with a first current supply when the status signal indicates the first status and with a second current supply when the status signal indicates the second status different from the first status.

11. An apparatus, comprising:
an external terminal;
an output circuit configured to be coupled to the external terminal and have an impedance according to a value of a code signal;
a comparator configured to produce a judgment signal by comparing a voltage potential at the external terminal and a reference voltage potential;
a counter circuit configured to update the value of the code signal according to a periodic cycle signal, responsive to the judgment signal; and
a timing generator configured to produce the periodic cycle signal having a first cycle period when a status signal indicates a first status that is defined by a reset signal and the periodic cycle signal having a second cycle period when the status signal indicates a second status that is defined by a calibration signal;
wherein the timing generator comprises a clock generator configured to generate first and second clocks when the periodic cycle signal is activated, and further comprises a cycle signal generator configured to produce the periodic cycle signal responsive to the first and second clocks, and
wherein the cycle signal generator produces the periodic cycle signal corresponding to the first clock when the status signal indicates the first status and the periodic cycle signal corresponding to the second clock when the status signal indicates the second status.

12. The apparatus as claimed in claim 11, wherein the timing generator comprises a shift register configured to receive the periodic cycle signal and output the first and second clocks.

* * * * *